(12) United States Patent
Feng et al.

(10) Patent No.: US 10,944,271 B1
(45) Date of Patent: Mar. 9, 2021

(54) DOCK DEVICE WITH CIRCUIT TO DETECT CHARGE PIN ALIGNMENT

(71) Applicant: AMAZON TECHNOLOGIES, INC., Seattle, WA (US)

(72) Inventors: Ming Feng, Cupertino, CA (US); Benjamin Thomas Gaide, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 16/588,021

(22) Filed: Sep. 30, 2019

(51) Int. Cl.
*H02J 7/00* (2006.01)
*H01R 13/22* (2006.01)
*H03K 5/24* (2006.01)

(52) U.S. Cl.
CPC ............. *H02J 7/00* (2013.01); *H01R 13/22* (2013.01); *H03K 5/24* (2013.01)

(58) Field of Classification Search
CPC ............. H02J 7/00; H01R 13/22; H03K 5/24
See application file for complete search history.

(56) References Cited

U.S. PATENT DOCUMENTS

2003/0222503 A1* 12/2003 Lam .................. G06F 1/266
307/38

* cited by examiner

*Primary Examiner* — Robert L Deberadinis
(74) *Attorney, Agent, or Firm* — Lindauer Law, PLLC

(57) ABSTRACT

A first device, such as a charger, includes electrical contacts to supply power to a second device, such as a wearable device. The first device includes a detection circuit that measures a sense voltage proportional to an effective resistance, which includes resistances of the contacts, an internal resistance of the second device, and any contaminants between the contacts. When the sense voltage is within a range, the detection circuit determines the second device is compatible and correctly oriented and determines there are insufficient contaminants to alter the effective resistance. The first device de-energizes the contacts while the sense voltage is outside of a voltage range and provides a power supply to one or more of the contacts when the sense voltage is within the voltage range. In some aspects, the detection circuit may delay the power supply for a period of time to avoid false detection events.

20 Claims, 9 Drawing Sheets

DOCK DEVICE WITH CIRCUIT TO DETECT CHARGE PIN ALIGNMENT

BACKGROUND

A portable electronic device, such as a wearable device, may have a rechargeable battery that requires recharging.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

Figure 1:
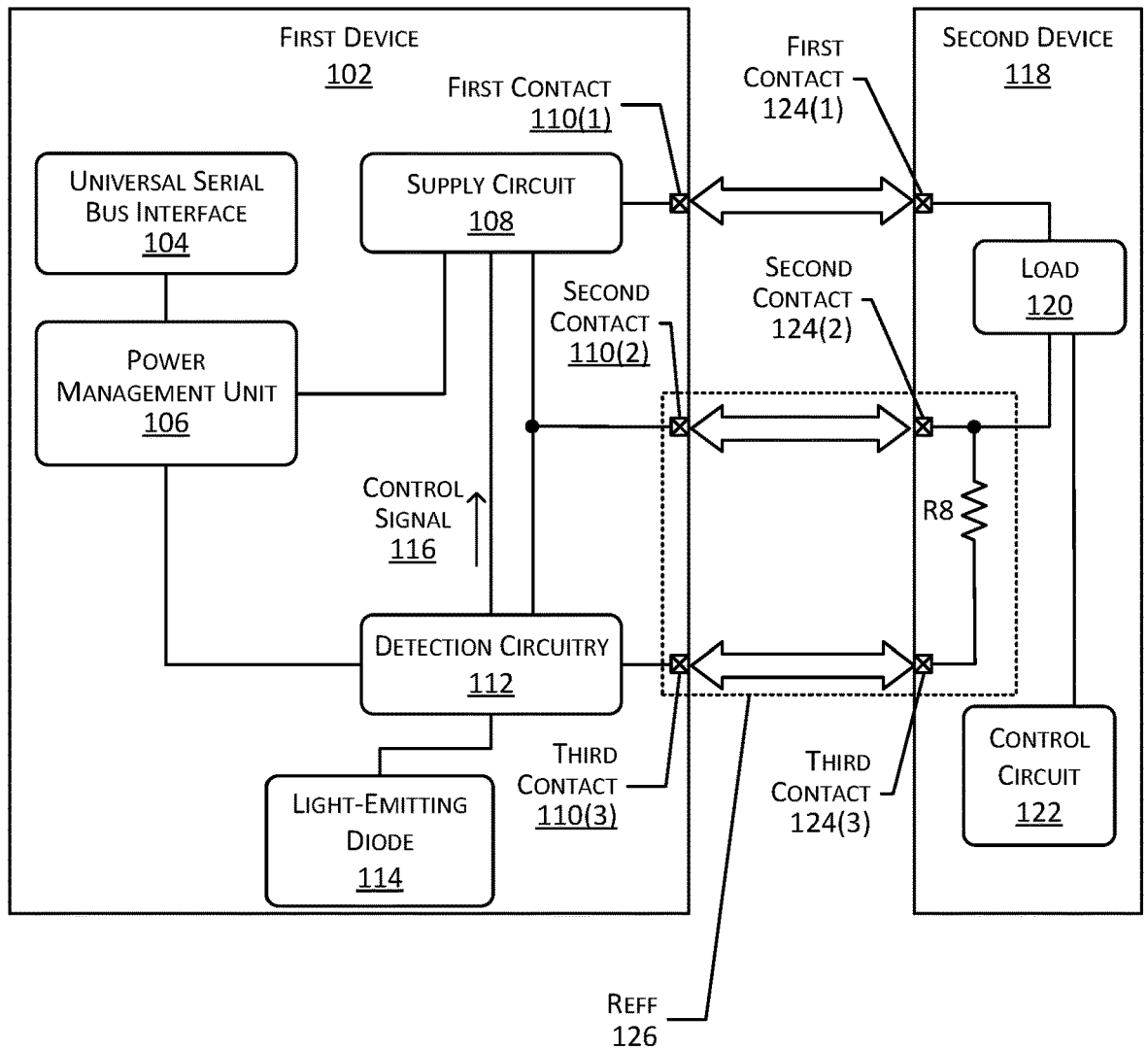
FIG. 1 depicts a block diagram of a system including a first device configured to detect a resistance within a predetermined range before providing a power supply to a second device, according to one implementation.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean "including, but not limited to".

The structures depicted in the following figures are not necessarily according to scale. Furthermore, the proportionality of one component to another may change with different implementations. In some illustrations the scale or a proportionate size of one structure may be exaggerated with respect to another to facilitate illustration, and not necessarily as a limitation.

DETAILED DESCRIPTION

Portable electronic devices, such as a wearable device, are used in a variety of situations and rely on electrical power during operation. For example, a user may wear a wearable device. The wearable device may present information to the user, acquire data about the user's physical condition such as pulse rate, physical movement, and so forth.

The wearable device may include a physical form factor or external shape that facilitates wear. In one implementation, the wearable device may comprise a housing within which the electronics are mounted and a band which retains the housing to the user. For example, the wearable device may have a form factor similar to a wristwatch. The external shape of the wearable device may include one or more curves. These curves may facilitate wear, improve comfort, avoid sharp edges that could be uncomfortable for the user, and so forth. For example, a top portion of the housing may be convexly curved, while a bottom portion of the housing that comes into contact with the user during wear exhibits one or more curves.

The electrical power used during operation of the wearable device may be provided by a battery, capacitor, or other energy storage device. For example, the wearable device may include a rechargeable lithium-ion battery.

The energy storage device may be recharged from an external source, such as a wall plug, a Universal Serial Bus (USB) port of a computing device, and so on. Traditional recharge techniques may include connecting a cable to the wearable device. For example, a cable may be coupled on one end to an external power source and may include a connector (plug) on the other end that can be inserted into a jack on the wearable device to deliver electrical power to the wearable device. This electrical power may then be used to recharge the energy storage device in the wearable device. However, the connector and receptacle or port combination exhibits several disadvantages. For example, the receptacle or port in the wearable device either increases the overall volume of the wearable device or removes that volume for use by other components such as a battery.

Additionally, as small battery powered electronics (e.g., fitness bands, wireless earbuds, smart watches, and so on) become more ubiquitous and stylish, they are being exposed to increasingly harsh environments. Due to dust, sweat, water, abrasion, durability, size, and appearance considerations, designers of such devices avoid using conventional charger designs with plugs, connectors, receptacles, or ports for establishing the electrical contacts. For example, a port or opening for receiving the plug or connector may be prone to intrusion by contaminants such as sweat, dirt, and so forth.

Other traditional arrangements of providing electrical conductivity to a wearable device involve the use of contacts. For example, the weight of the wearable device may be used to maintain a connection between contacts on the wearable device and contacts in a cradle, but such connections are prone to inadvertent disconnection, such as by bumping the cradle or an underlying surface. Another arrangement relies on a particular external shape of the wearable device to mechanically engage external contacts. Unfortunately, the external contact may be prone to corrosion.

Contacts may be plated to improve conductivity, but this plating may be damaged due to electrolytic corrosion if contaminants are present and a voltage is applied. For example, the plated electrical contacts may corrode in seconds when the contacts are energized while sweat is present. For example, at voltages as low as 100 millivolts, electrolytic corrosion of the contacts can occur if there is sweat on the contacts.

Damage may also occur to internal circuitry if the power supply pins are energized when the wearable device is misaligned or contacts of the wearable device are moved across energized pins. For example, one or more of the wearable device or the charging device may generate heat and noise if the wearable device is inserted improperly. In another example, sliding the wearable device across the contacts of the charging device may cause visible sparks if the contacts are energized. Heating or sparking may also occur when contacts maintain a recharge voltage while the wearable device is misaligned relative to the recharge device, or when contacts of the recharge device contact a conductive metallic housing. Such sparking or heating may damage circuit components of the charging device, the wearable device, or both.

Described in this disclosure is a dock that provides for reliable and persistent electrical contact with an electronic device, such as a wearable device. The dock includes a circuit that detects a compatible device and detects proper alignment of the device by detecting the presence of an expected resistance before energizing its output contacts. The expected resistance may be an effective resistance that may include the resistances of first and second contacts associated with the charging device, first and second contacts associated with the wearable device, and a resistor within the wearable device. If contaminants such as liquid or debris are present, the contaminants may alter the effective resistance. For example, some contaminants, such as sweat or oil, may allow an electrical connection between the contacts but may represent additional resistance to current flow between the charging device and the wearable device. Other contaminants may limit or prevent the contacts from establishing a stable electrical connection. In either case, the circuit may determine the effective resistance is outside of an expected range by comparing a sense voltage to high and low thresholds and may turn off the power supply to the contacts.

In some implementations, the charging device may de-energize or decouple its contacts from a power supply bus until a device is detected that is compatible and properly aligned and until the effective resistance is determined to be within a pre-determined range, and then may provide a supply voltage to the wearable device. In an implementation, the circuit may delay application of the power supply to the contact when the device is first detected to avoid false detections and may immediately turn off the power supply to prevent device damage during insertion or when the device is bumped or jostled and the effective resistance is determined to be out of range. In one implementation, a factory programming pin or contact on the device may be used by the charging device to perform the above-described detection operation. In another implementation, a pair of charging pins or contacts may be de-energized or coupled to a ground in a first mode, may be used for device detection operations in a second mode, and may provide a power supply in a third mode.

Embodiments of the detection circuit are described below that utilize low-power, passive circuit components to perform the detection and switching operations. Since the detection circuit utilizes passive components, the detection circuit provides a relatively low-cost device detection functionality, as compared to a detection circuit that utilizes a programmable device, such as a microcontroller unit (MCU). While an implementation that uses an MCU may be configured to provide similar functionality, the detection circuits described below with respect to FIGS. 1 and 2 do not rely on any programmable device (e.g. an MCU) and require no software or firmware development. Additionally, the contact that is used by the detection circuit to perform the detection operations can be a multi-function contact. For example, the detection contact can also provide a low speed communication link for use by a manufacturer for testing or other uses. The comparators operate faster than many microcontrollers and with higher precision. Moreover, such comparators are readily available and reliable at a cost per-unit cost, allowing for a low-cost bill of materials.

In some embodiments, the dock may include a first contact, a second contact, and a third contact. The first and second contacts may provide power to a wearable device for recharging its battery. The third contact may be used by a detection circuit to detect the presence of a compatible device, to determine proper alignment of the device, and to verify that any contaminants present are insufficient to alter the effective resistance including the electrical interconnections between the dock and the device as well as an internal resistor of the device. Once the presence and alignment of the device are verified, and the effective resistance is determined to be within a predetermined range, the circuit may trigger the dock to supply power to the device via the first and second contacts.

The detection circuit within the dock may include a window comparator circuit configured to detect an effective resistance of the device that is within a predetermined range. Abnormal situations, such as the presence of contaminants (liquid, oil, debris, dirt, and so on), incorrect alignment of the device relative to the dock; or a device with an incorrect internal resistance, will cause the window comparator circuit to determine that the effective resistance is out of range. The charging contacts of the dock may be de-energized in a default state and the power supply may be switched off. The detection circuit within the dock may apply a low voltage to a detection contact. If the detection circuit detects an effective resistance within a predetermined range, the detection circuit may turn on the power supply output to supply power to the second device. If the effective resistance is outside the specified range, the detection circuit may turn off the power source output and keep the contacts de-energized. In one example, the detection circuit may couple the contacts to an electrical ground so that sweat or other liquid on the contacts does not cause electrolytic corrosion and so that sliding a device across the contacts does not cause sparks. The detection circuit may keep the contacts de-energized (or coupled to an electrical ground) until the detection circuit determines the presence of an effective resistance in the predetermined range. In some implementations, the dock may include a visual indicator, such as a light-emitting diode (LED), which may be configured to illuminate in response to resistance that is out of range.

The circuits and systems described below may be included within a recharge device, such as the dock depicted in FIG. 6 below. The dock may include a plurality of electrical contacts and a circuit coupled to the electrical contacts. The circuit may be configured to detect a compatible device coupled to the contacts and to determine proper alignment of the device relative to the contacts. The circuit may also determine that an effective resistance is within a predetermined range before applying power to one or more of the contacts to recharge the device. The effective resistance may include the resistance of a resistor that is internal to the compatible device, contact resistances of the electrical contacts between the circuit and the compatible device, and resistances due to any corrosion or contaminants on one or more of the contacts. In some implementations, the circuit may include dual comparators to determine if a sense voltage is within a voltage range, where the sense voltage is proportional to the effective resistance. The sense voltage being outside of the voltage range may indicate one or more of an incompatible device, a device with an incorrect internal resistance, improper alignment, or the presence of contaminants. One implementation of such a device is described below with respect to FIG. 1.

FIG. 1 depicts a block diagram of a system 100 including a first device 102 configured to detect an effective resistance within a predetermined range before providing a power supply to a second device 118, according to one implementation. The first device 102 may be an implementation of a charging device, such as the dock depicted in FIG. 6. The second device 118 may be a wearable device or other portable device. In some implementations, the second device 118 may have a form factor similar to a wristwatch and may present information to the user, acquire data about the user's physical condition such as pulse rate, physical movement, and so forth.

The first device 102 may include a universal serial bus (USB) interface 104, which may be coupled to a USB cable to receive a power supply from a USB port of a wall socket plug with a USB port, a USB wall charger, a USB port of a computing device, another USB power source, and so on. In an alternative embodiment, in lieu of or in addition to the USB interface 104, the first device 102 may include a power interface, which may be configured to couple to a wall socket and which may include one or more transformers configured to step down a voltage from the wall socket to a usable voltage level for circuitry within the first device 102.

The first device 102 may include a power management unit 106, which may be configured to direct power to various components of the first device 102. In some implementations, the power management unit 106 may filter noise from the power supply, distribute power supplies to one or more circuit components, and so forth.

The first device 102 may include a supply circuit 108 coupled to the power management unit 106, to a first contact 110(1) and to a second contact 110(2). The supply circuit 108 may electrically couple the first contact 110(1) and the second contact 110(2) to an electrical ground or may de-energize the first contact 110(1) and the second contact 110(2) when the first device 102 is not performing a recharge operation. During a recharge operation, the supply circuit 108 may provide a power supply to the first contact 110(1) and may couple the second contact 110(2) to an electrical ground or to a second charging signal. The charging signal may be a voltage or a current, depending on the implementation. For example, the supply circuit 108 may apply a first current to the first contact 110(1) and may provide a return current path via the second contact 110(2), such as by coupling the second contact 110(2) to an electrical ground. In another example, the first signal may be a selected voltage. In this example, the supply circuit 108 may apply a first voltage to the first contact 110(1) and may apply a second voltage to the second contact 110(2) to provide a voltage potential between the first contact 110(1) and the second contact 110(2) that is greater than zero.

The first device 102 may also include detection circuitry 112, which may be coupled to the power management unit 106, to the supply circuit 108, to the second contact 110(2), and to a third contact 110(3). The detection circuitry 112 may be configured to determine that the second device 118 is compatible with the first device 102 and that the second device 118 is aligned correctly with respect to the contacts 110 of the first device 102. Additionally, the detection circuitry 112 may be configured to determine an effective resistance $R_{EFF}$ 126 between the first device 102 and the second device 118. The effective resistance $R_{EFF}$ 126 may include resistances of contacts 110(2) and 110(3), resistances of contacts 124(2) and 124(3), a resistance of a resistor R8 within the second device 118, and parasitic resistances due to the wire traces. The resistor R8 may be called a detection resistor. When contaminants such as liquids, debris, and the like are present on or between one or more of the contacts 110 or 124, the effective resistance $R_{EFF}$ 126 may change, allowing the detection circuitry 112 to detect the presence of the contaminants. The detection circuitry 112 may also be coupled to a visual indicator, such as a light-emitting diode 114.

The second device 118 may include a plurality of contacts 124, which may be releasably coupled to the contacts 110 of the first device 102 to form an electrical connection. The second device 118 may include a load 120 coupled between a first contact 124(1) and a second contact 124(2) of the second device 118. The load 120 may also be coupled to a control circuit 122, which may include sensors, comparators, microprocessor circuits, a display, other circuit elements, or any combination thereof. The second device 118 may include a factory-programming pin or third contact 124(3), and a resistor R8 coupled between the third contact 124(3) and the second contact 124(2).

The detection circuitry 112 may apply a detection signal to the third contact 110(3) and may determine a sense voltage that is proportional to an effective resistance $R_{EFF}$ 126. The effective resistance $R_{EFF}$ 126 may include the resistances of contacts 110(2), 110(3), 124(2), 124(3); the resistance of the resistor R8 within the second device 118; and the resistance presented by contaminants or corrosion, if any, on one or more of the contacts 110(2), 110(3), 124(2), 124(3). In an example, the effective resistance $R_{EFF}$ 126 may include an open circuit, when the second device 118 is not electrically coupled to the contact 110(3). The detection circuitry 112 may compare the sense voltage to a voltage range. If the sense voltage is outside of the voltage range, then the detection circuitry 112 may determine the effective resistance is outside of an expected range. The determination that the effective resistance $R_{EFF}$ 126 is out of range may indicate that the second device 118 is not compatible with the first device 102, that the contacts 124 of the second device 118 are not aligned to the contacts 110 of the first device 102, that there are contaminants such as liquid or debris present on one of the contacts 110 or 124, or any combination thereof.

In some implementations, the detection circuitry 112 may determine that the sense voltage is outside of the predetermined voltage range and may send a first control signal 116(1) to the supply circuit 108, causing the supply circuit 108 to apply a first signal to the first contact 110(1). In some implementations, the contacts 110 and 124 may include plating material, which may corrode quickly when moisture is present on an energized contact 110 or 124. For example, a voltage of approximately 100 millivolts may be sufficient to cause electrolytic corrosion of the contact 110 or 124. In one example, the contacts 110 or 124 may corrode in 30 seconds or less if energized while sweat is present. Accordingly, when the sense voltage is outside of the predetermined voltage range, the supply circuit 108 may couple the contacts 110(1) and 110(2) to an electrical ground or may apply a zero-voltage signal to prevent electrolytic corrosion.

If the detection circuitry 112 determines that the sense voltage is within the voltage range, then the effective resistance $R_{EFF}$ 126 is within an expected range. Determination that the effective resistance $R_{EFF}$ 126 is within the expected range may indicate that the second device 118 is compatible with the first device 102, that the contacts 124 of the second device 118 are aligned to the contacts 110 of the first device 102, and that there are insufficient (or no) contaminants on one or more of the contacts 110 or 124 to alter the effective resistance $R_{EFF}$ 126. In this instance, the detection circuitry 112 may send a second control signal 116(2) to the supply circuit 108, triggering the supply circuit 108 to apply a second voltage to the first contact 110(1). The second signal may be a power supply sufficient to drive the load 120 of the second device 118. For example, the second signal may be a power supply to recharge a battery of the second device 118 or an operating voltage to power the second device 118. The supply circuit 108 may couple the second contact 110(2) to an electrical ground or to a voltage that is less than a voltage of the second signal applied to the first contact 110(1) to establish a voltage potential that is greater than zero between the first contact 110(1) and the second contact 110(2).

In some implementations, the control signal 116 may either activate the supply circuit 108 to energize the first contact 110(1) or to shut off the supply circuit 108. In another implementation, the supply circuit 108 may be turned off or disengaged in a first, default state. In response to the control signal 116 when the sense voltage is within a predetermined voltage range, the supply circuit 108 may couple a power supply bus to the first contact 110(1) in response to the control signal 116 when the sense voltage is outside of the predetermined voltage range and to engage or connect to the first contact 110(1) when the sense voltage is within the predetermined voltage range. Other implementations are also possible.

In some implementations, the detection circuitry 112 may include a voltage divider circuit including a first node to provide the sense voltage and a second node coupled to the third contact 110(3). If the effective resistance $R_{EFF}$ 126 is larger or smaller than an expected resistance, the sense voltage may be outside of the voltage range. If the second device 118 has a first alignment in which the contacts 124 of the second device 118 do not align with the contacts 110 of the first device 102, the detection circuitry 112 may detect an open circuit. If the second device 118 has a second alignment in which the contacts 124 of the second device 118 form electrical connections with the contacts 110 of the first device 102, the presence of contaminants between the third contact 110(3) and the third contact 124(3), between the second contact 110(2) and the second contact 124(2), on any of the contacts 110 or 124, or any combination thereof may cause the detection circuitry 112 to determine the sense voltage is outside of the voltage range. In some implementations, the presence of contaminants may increase the effective resistance $R_{EFF}$ 126, reducing the sense voltage. In other implementations, the presence of contaminants may decrease the effective resistance $R_{EFF}$ 126.

In the illustrated example, the first device 102 may include a visual indicator, such as the light-emitting diode (LED) 114. In one implementation, the detection circuitry 112 may activate the LED 114 when the sense voltage is out of the predetermined voltage range. The illumination of the LED 114 may indicate a fault condition, such as an incompatible device, an incorrect alignment of the second device 118 relative to the first device 102, or contaminants between the first device 102 and the second device 118. In another implementation, the detection circuitry 112 may activate the LED 114 when the sense voltage is within the predetermined voltage range, indicating that power is being supplied to the second device 118 by the first device 102. Other implementations are also possible.

The detection circuitry 112 of the first device 102 may be implemented in various ways. One implementation is described below with respect to FIG. 2.

Figure 2:
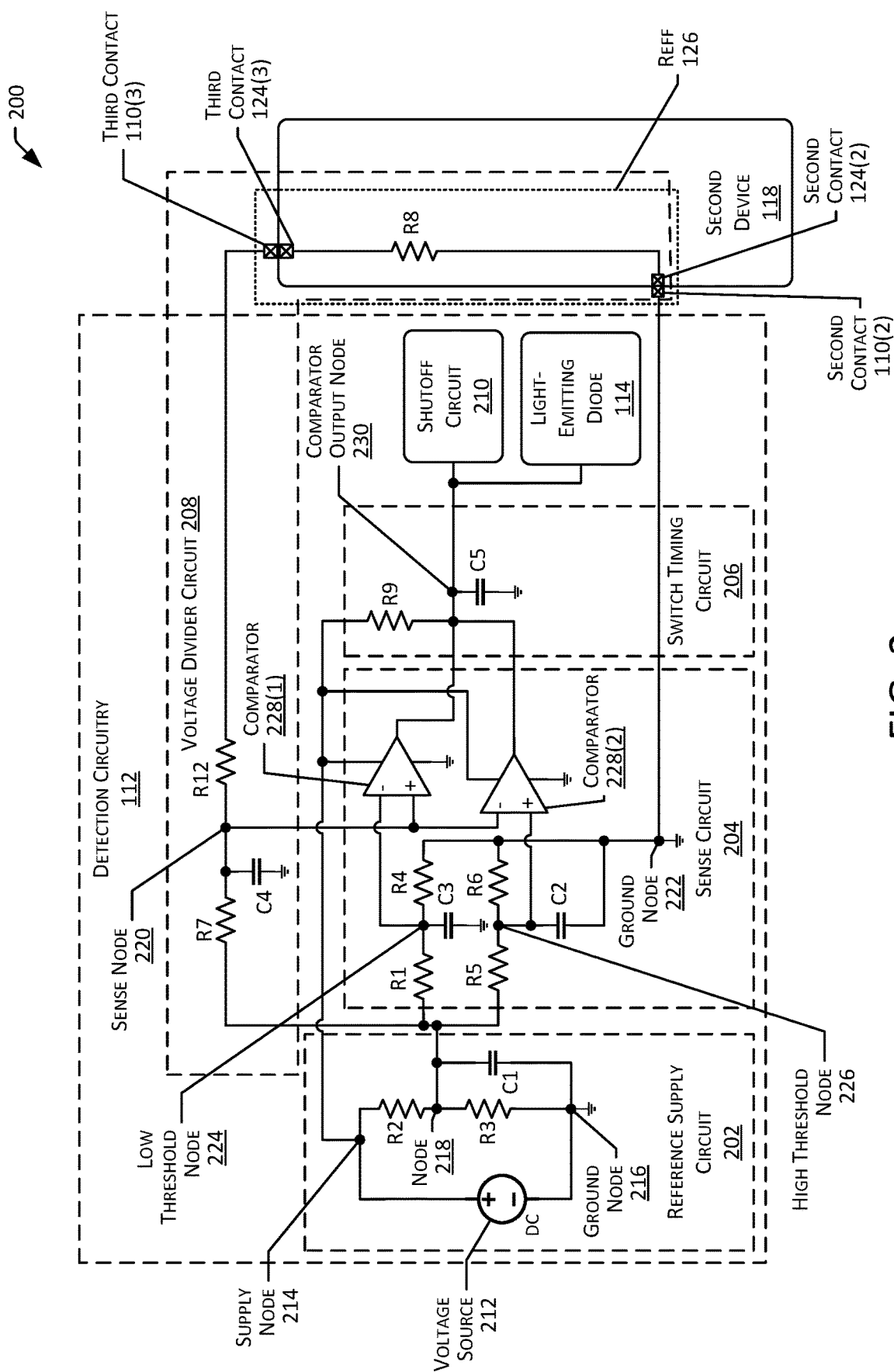
FIG. 2 depicts a diagram of detection circuitry to detect a resistance within a predetermined range before supplying power to a second device, according to one implementation.

FIG. 2 depicts a diagram 200 of detection circuitry 112 to detect charge pin alignment before supplying power to a second device 118, according to one implementation. The detection circuitry 112 may include a reference supply circuit 202 including a first output coupled to a sense circuit 204, which includes an output coupled to a shutoff circuit 210 via a switch timing circuit 206. The reference supply circuit 202 may include a second output coupled to the switch timing circuit 206. The detection circuitry 112 may include a voltage divider circuit 208 coupled to the first output of the reference supply circuit 202. The voltage divider circuit 208 may cooperate with the input resistor R8 in the second device 118.

The reference supply circuit 202 may include a voltage source 212, which may be a direct current (DC) voltage supply. The voltage source 212 may be coupled between a supply node 214 and a ground node 216. The reference supply circuit 202 may include a resistor R2 coupled between the supply node 214 and an output node 218 and may include a resistor R3 coupled between the output node 218 and the ground node 216. Resistors R2 and R3 operate as a voltage divider to produce an output voltage that may be used as a detection voltage to detect an effective resistance $R_{EFF}$ 126. The reference supply circuit 202 may also include a capacitor C1 coupled between the output node 218 and the ground node 216. The capacitor C1 may operate as an output filter.

The voltage divider circuit 208 may include a resistor R7 coupled between the output node 218 and a sense node 220, a resistor R12 coupled between the sense node 220 and the third contact 110(3), and a capacitor C4 coupled between the sense node 220 and an electrical ground. The resistors R7 and R12 may cooperate with the input resistor R8, resistances of contacts 110(2), 110(3), 124(2), and 124(3), parasitic resistances of wire traces, and resistances due to any contaminants to produce a sense voltage at the sense node 220 that is proportional to a detection voltage at the third contact 110(3). The resistor R12 also provides some protection for the comparators 228 from electrostatic discharge at the first contact 110(1).

The sense circuit 204 may include a first comparator 228(1), which may include a comparator (negative) input coupled to a low threshold node 224, a comparator (positive) input coupled to the sense node 220, and an output coupled to a comparator output node 230. The first comparator 228(1) may also include a first supply input coupled to the supply node 214 and a second supply input coupled to an electrical ground. The sense circuit 204 may also include a second comparator 228(2), which may include a comparator (positive) input coupled to a high threshold node 226, a second comparator input coupled to the sense node 220, and an output coupled to the comparator output node 230. The second comparator 228(2) may also include a first supply input coupled to the supply node 214 and a second supply input coupled to an electrical ground. The comparator output node 230 receives the outputs of the comparators 228 and passively combines the outputs in a manner that is analogous to a logic AND gate, such that if the output of either the first comparator 228(1) or the second comparator 228(2) is low, then the voltage at the comparator output node 230 is low. If both the outputs of both of the comparators 228(1) and 228(2) are high, then the voltage at the comparator output node 230 is high. In some implementations, a low voltage may be at a voltage level that is below a threshold voltage, such as a turn on threshold voltage of a transistor (e.g., approximately 0.6 volts) or an enable voltage threshold level of a low dropout regulator.

The sense circuit 204 may include a resistor R1 coupled between the output node 218 of the reference supply circuit 202 and the low threshold node 224. The sense circuit 204 may include a resistor R4 coupled between the low threshold node 224 and a power supply conductor, such as a ground node 222. The sense circuit 204 may also include a resistor R5 coupled between the output node 218 and the high threshold node 226, a resistor R6 coupled between the high threshold node 226 and the ground node 222, and a capacitor C2 coupled between the high threshold node 226 and the ground node 222.

The switch timing circuit 206 may include a resistor R9 coupled between the supply node 214 and the comparator output node 230. The switch timing circuit 206 may also include a capacitor C5 coupled between the comparator output node 230 and an electrical ground. The comparator output node 230 may be coupled to a shutoff circuit 210, which may send the control signals 116 to the supply circuit 108 in FIG. 1. The resistor R9 and the capacitor C5 may cooperate to provide a timing constant to delay the sending of the control signals 116. Other implementations are also possible.

In the illustrated example, the second contact 124(2) and the third contact 124(3) of the second device 118 are electrically connected to the second contact 110(2) and the third contact 110(3) of the first device 102, respectively. The resistor R8 of the second device 118 is coupled between the second contact 124(2) and the third contact 124(3). Thus, the input resistor R8 is in a series with the resistors R7 and R12. The effective resistance R$_{EFF}$ 126 may include the second contact 124(2), the third contact 124(3), the second contact 110(2), the third contact 110(3), the resistor R8, parasitic resistances of internal wire traces, and, if present, any contaminants. The effective resistance R$_{EFF}$ 126 may be determined according to the following equation:

$$REFF_{126} = R8 + R_{110(1)} + R_{110(2)} + R_{124(1)} + R_{124(2)} + R_{parasitic} \quad \text{(Equation 1)}.$$

In some implementations, the reference supply circuit 202 includes the voltage source 212, resistors R2 and R3, and capacitor C1. The reference supply circuit 202 provides a pull-up voltage for the comparator output node 230 as well as the output voltage at the output node 218 for detection at the sense node 220 and for the comparator reference voltages at the low threshold node 224 and the high threshold node 226. The reference voltage VREF at the output node 218 may be determined according to the following equation:

$$VREF = \frac{V_{212} * R2}{R2 + R3}. \quad \text{(Equation 2)}$$

The capacitor C1 is used to stabilize the reference voltage for noise immunity.

The voltage divider circuit 208 includes the resistors R7 and R12 of the detection circuitry 112 within the first device 102 and the input resistor R8 in the second device 118. The sense voltage VSENSE is proportional to the reference voltage VREF and to the voltage across the input resistor R8, and can be determined according to the following equation:

$$VSENSE = VREF * \frac{R12 + R8}{R7 + R12 + R8}. \quad \text{(Equation 3)}$$

In this implementation, the resistors R7 and R12 operate in conjunction with the capacitor C4 to form a T-filter circuit, which can stabilize the sense voltage VSENSE for noise immunity. For example, bumping the second device 118 or movement of the second device 118 relative to the contacts 124 may induce noise, which can be filtered by the T-filter circuit. The resistor R12 provides some protection for the third contact 110(3) from capacitive loading of the capacitor C4.

In some implementations, the comparators 228(1) and 228(2) are dual comparators with the open drain (or collector) output. The comparators 228(1) and 228(2) cooperate to form a window comparator circuit to compare the sense voltage VSENSE to a low voltage threshold THL and a high voltage threshold THH. The resistors R5 and R6 set the high voltage threshold THH according to the following equation:

$$THH = VREF * \frac{R6}{R5 + R6}. \quad \text{(Equation 4)}$$

The resistors R1 and R4 may set the detection low threshold THL. The detection low threshold THL can be determined according to the following equation:

$$THL = VREF * \frac{R4}{R1 + R4}. \quad \text{(Equation 5)}$$

The capacitors C3 and C2 may stabilize the low voltage threshold THL and the high voltage threshold THH, respectively, for noise immunity. For example, noise from various sources may be present at the low threshold node 224 and the high threshold node 226, which may be represented as high frequency components within the low voltage threshold THL and the high voltage threshold THH, and the capacitors C3 and C2 may shunt the high frequency components to a ground.

The resistor R9 and the capacitor C5 of the switch timing circuit 206 may provide a resistor-capacitor (RC) low-pass filter within the switch timing circuit 206. The RC low-pass filter may provide a timing delay to slow down a turn on time of the shutoff circuit 210 to avoid false detection. For example, the sense voltage VSENSE at the sense node 220 may fluctuate due to transient alignment of the second contact 124(2) and the third contact 124(3) of the second device 118 relative to the second contact 110(2) and the third contact 110(3) of the first device 102. The switch timing circuit 206 delays the shutoff circuit 210 for a period of time corresponding to the RC time constant to prevent false detection of electrical coupling between the first device 102 and the second device 118. However, the relatively low output resistance of the comparator output node 230 enables the shutoff circuit 210 to provide a very fast turn-off time when the sense voltage VSENSE is outside of the range defined by the high voltage threshold THH and the low voltage threshold THL. In some implementations, the low output resistance of the comparator output node 230 enables the detection circuitry 112 to provide the control signal 116 from the shutoff circuit 210 to turn off the supply circuit 108 quickly and independent of the time constant. The fast turn-off time provides protection from exposure to moisture and from sparking or other faults when the second device 118 is bumped or moved.

In some implementations, when the sense voltage VSENSE is greater than the high voltage threshold THH, the effective resistance $R_{EFF}$ 126 is out of range. The effective resistance $R_{EFF}$ 126 being out of range may be indicative of an incompatible device or of a first alignment where one or more of the contacts 124 are not aligned to the contacts 110. In this instance, the output of the comparators 228(1) and 228(2) may be below a threshold level. In response to the low output of the comparators 228(1) and 228(2), the shutoff circuit 210 may send a control signal 116 to turn off the power output of the supply circuit 108. For example, the control signal 116 may cause the supply circuit 108 to couple the first contact 110(1) to an electrical ground.

When the sense voltage VSENSE is less than the low voltage threshold THL, the effective resistance $R_{EFF}$ 126 is out of range. For example, in this instance, the effective resistance $R_{EFF}$ 126 may have a resistance that is greater than an expected resistance, which may indicate that the second device 118 is not compatible with the first device 102 or that the second device 118 is not electrically connected to the contacts 110. Once again, the shutoff circuit 210 may send a control signal 116 to turn off the power output of the supply circuit 108. For example, the control signal 116 may cause the supply circuit 108 to couple the first contact 110(1) to an electrical ground.

When the sense voltage VSENSE is greater than the low voltage threshold THL and less than the high voltage threshold THH, the effective resistance $R_{EFF}$ 126 is within an expected range. In this example, the output of the comparators 228(1) and 228(2) may be above a threshold. The shutoff circuit 210 may provide a control signal 116 that may cause the supply circuit 108 to apply a second signal to the first contact 110(1) to deliver power to the second device 118.

It should be appreciated that the voltage range established by the low voltage threshold THL and the high voltage threshold THH may correspond to an effective resistance $R_{EFF}$ 126 that includes an expected resistance value of the input resistor R8 and expected resistances of the contacts 110 and 124 and wire traces within a range of manufacturing tolerances. The shutoff circuit 210 and the supply circuit 108 may have various circuit configurations for providing the functionality described herein. One example is described below with respect to FIG. 3.

Figure 3:
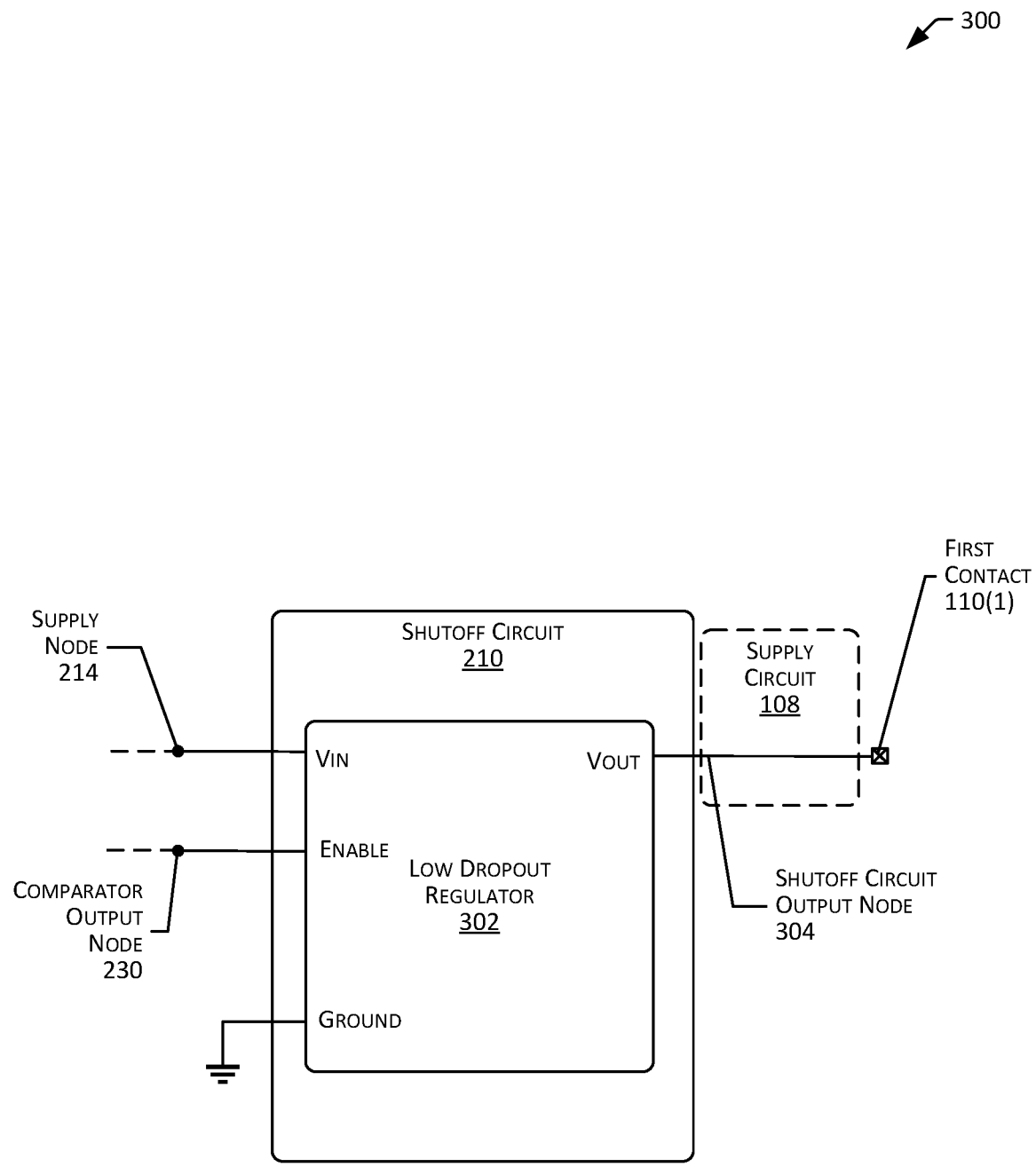
FIG. 3 depicts a diagram of the system of FIG. 1 including a shutoff circuit and a supply circuit, according to one implementation.

FIG. 3 depicts a diagram of the system 300 of FIG. 1 including a shutoff circuit 210 and a supply circuit 108, according to one implementation. In this example, the shutoff circuit 210 is depicted as being coupled to the comparator output node 230 and to the supply circuit 108. The supply circuit 108 may include an electrical conductor coupled between the first contact 110(1) and an output of the shutoff circuit 210. In some implementations, the supply circuit 108 may include a resistor (not shown) coupled between the drain of the MOSFET Q1 and the first contact 110(1).

The system 300 may include the shutoff circuit 210 comprising a low dropout regulator 302. The low dropout regulator 302 may include a voltage input coupled to the supply node 214, an enable input coupled to the comparator output node 230, and a supply input coupled to ground. The low dropout regulator 302 includes an output coupled to the shutoff circuit output node 304. The shutoff circuit output node 304 may be coupled to the first contact 110(1).

The outputs of the comparators 228 may be coupled to the comparator output node 230. The comparator output node 230 may be coupled to the enable input of the low dropout regulator 302. When either of the outputs of the comparators 228(1) or 228(2) are below an enable voltage threshold level indicating that a sense voltage at the sense node 220 is outside of the predetermined voltage range, the low dropout regulator 302 may decouple the first contact 110(1) from the supply node 214. In an alternative implementation, the low dropout regulator 302 may couple the first contact 110(1) to ground when the sense voltage at the sense node 220 is outside of the predetermined voltage range.

When the outputs of the comparators 228 have a voltage level that is greater than or equal to an enable voltage threshold level indicating that the sense voltage at the sense node 220 is within the predetermined voltage range, the voltage at the comparator output node 230 may be higher than the enable voltage threshold level of the low dropout regulator 302. In this example, the low dropout regulator 302 may couple the first contact 110(1) to the supply node 214.

Figure 4:
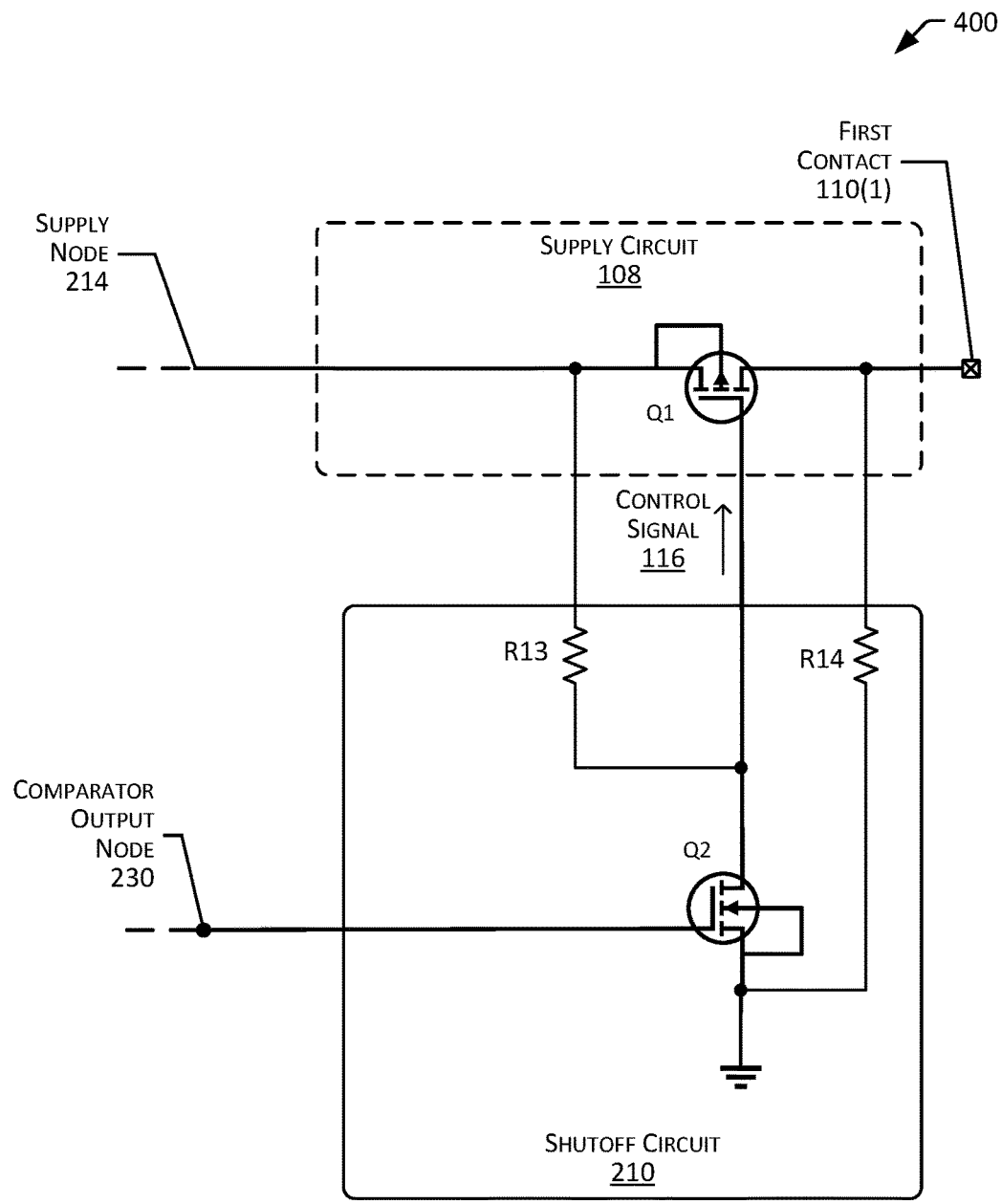
FIG. 4 depicts a diagram of the system of FIG. 1 including a shutoff circuit and a supply circuit, according to one implementation.

FIG. 4 depicts a diagram of the system 400 of FIG. 1 including a shutoff circuit 210 and a supply circuit 108, according to one implementation. In this example, the low dropout regulator 302 of the example of FIG. 3 is replaced with an n-channel MOSFET Q2. In this example, the supply circuit 108 may include a p-channel MOSFET Q1 including a source coupled to the supply node 214, a gate, and a drain coupled to the first contact 110(1).

The shutoff circuit 210 may include an n-channel MOSFET Q2 including a source coupled to ground, a gate coupled to the comparator output node 230, and a drain coupled to the gate of the MOSFET Q1. The shutoff circuit 210 may include a resistor R13 coupled between the supply node 214 and the source of the MOSFET Q2. Additionally, the shutoff circuit 210 may include a resistor R14 coupled between the drain of the MOSFET Q1 and ground.

In this example, if the sense voltage at the sense node 220 is out of range, at least one of the outputs of the comparators 228 is low so that the voltage at the comparator output node 230 is low. The low voltage at the comparator output node 230 maintains the n-channel MOSFET Q2 in an off state. The voltage at the drain of the MOSFET Q2 may rise to a level of the voltage at the supply node 214, keeping the p-channel MOSFET Q1 in an off-state, decoupling the first contact 110(1) from the supply node 214. The resistor R14 may dissipate any voltage at the first contact 110(1) and may provide some protection for the circuitry from electrostatic discharge from the first contact 110(1).

If the sense voltage at the sense node 220 is within range, both outputs of the comparators 228 are high, and the voltage at the comparator output node 230 is high, turning on the MOSFET Q2. The MOSFET Q2 allows current to flow to ground, reducing the voltage at the gate of the MOSFET Q1. In response to the low voltage at the gate, the MOSFET Q1 turns on, coupling the supply node 214 to the first contact 110(1), enabling the charging contact 110(1).

In one example, the threshold turn-on voltage for the n-channel MOSFET Q2 may be approximately 0.7 volts or greater. The turn-off voltage for the p-channel MOSFET Q1 may be approximately 0.6 volts. Thus, when the voltage at the comparator output node 230 is below 0.7 volts, the MOSFET Q2 and the MOSFET Q1 are both turned off. When the voltage at the comparator output node 230 is above 0.7 volts, the MOSFET Q2 is turned on, pulling the voltage down at the drain of the MOSFET Q2 to a level that is approximately equal a voltage across the MOSFET Q2. In one possible example, the voltage may be approximately 0.1 volts, which may activate the MOSFET Q1 to couple the supply node 214 to the first contact 110(1).

While the transistor configuration of the supply circuit 108 and the shutoff circuit 210 are shown as including MOSFETs, it should be appreciated that the MOSFETs could be replaced with bipolar junction transistors or other switching devices, depending on the implementation. The transistors provide fast switching and low power consumption, allowing for decoupling or disengaging the power supply from the first contact 110(1) in a first mode (when the second device is not compatible, not aligned with the first device 102, or when contaminants are present), and for coupling the power supply to the first contact 110(1) in a second mode (when the device is compatible and properly aligned, and when contaminants are not present or insufficient to impact the effective resistance $R_{EFF}$ 126). Other implementations are also possible.

The shutoff circuits 210 as shown in FIGS. 3 and 4 are implemented entirely in hardware. By implementing the shutoff circuit 210 in hardware and independent of software, the shutoff circuit 210 can operate more quickly than a software implementation. The hardware implementation can be cheaper than an implementation that involves software and a processor circuit. While the implementation in FIG. 3 uses a low dropout regulator 302 to provide the supply voltage and the implementation in FIG. 4 includes an n-channel MOSFET Q1 to provide the control signal 116, other implementations are also possible.

Figure 5:
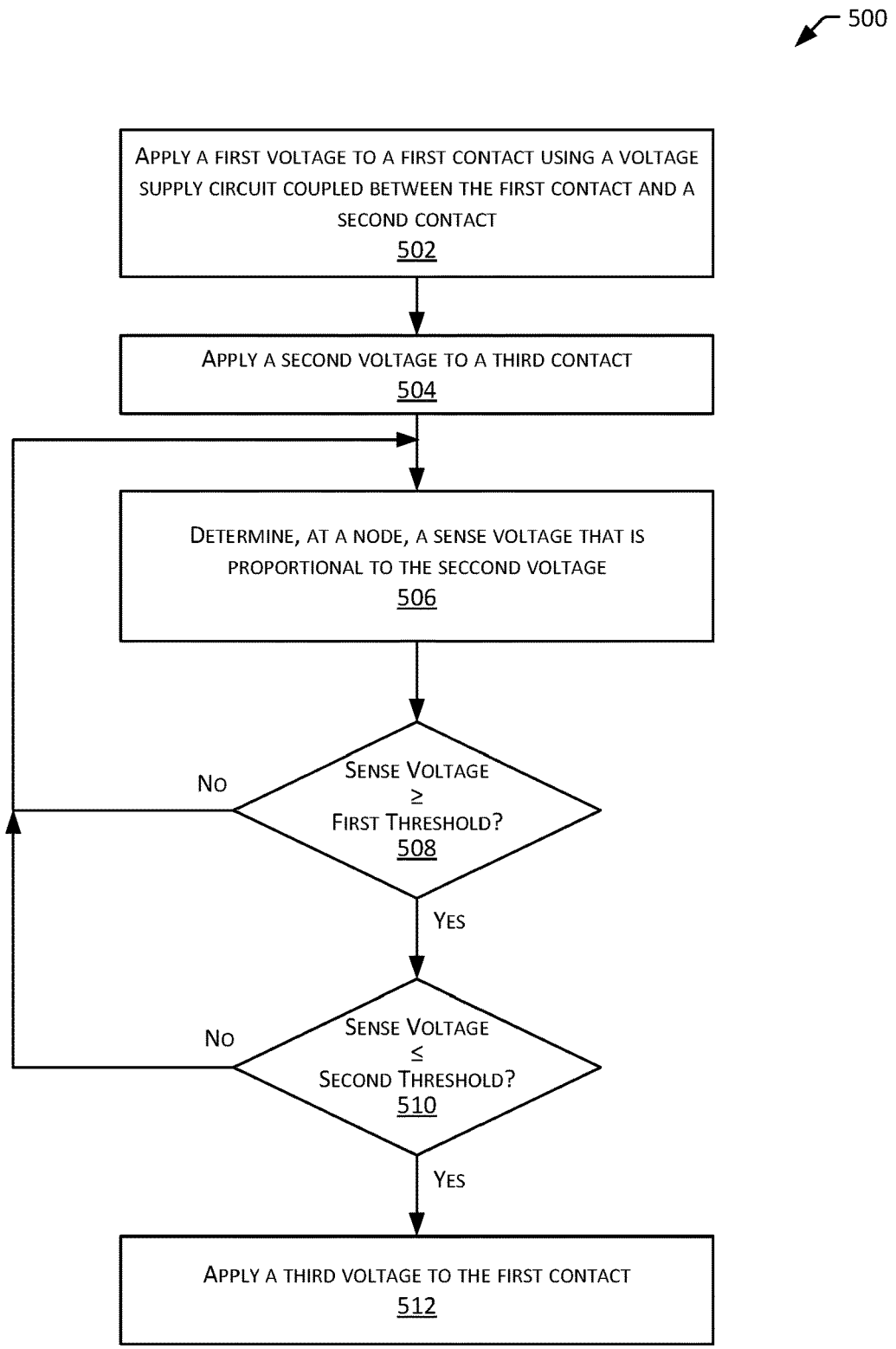
FIG. 5 depicts a flow diagram of a method of detecting a sense voltage within a voltage range, according to one implementation.

FIG. 5 depicts a flow diagram 500 of a method of detecting a sense voltage within a predetermined voltage range, according to one implementation. The sense voltage may be determined from a sense node 220 within a voltage divider circuit 208 that includes a pair of resistors R7 and R12 within the first device 102 and an input resistor R8 within the second device 118. With this configuration, a change in the effective resistance $R_{EFF}$ 126 can be detected based on a change in the sense voltage. Since the values of the resistors R7, R12, and R8 and the resistances of the wire traces and contacts 110 and 124 do not change, the change in the effective resistance $R_{EFF}$ 126 may be indicative of the presence of contaminants (liquid, debris, and so on) or the presence of a second device 118 that is not compatible with the first device 102. For example, the second device 118 may have been manufactured by a competitor or another unauthorized source and may include a resistor R8 that is different from the expected resistance. In another example, the contaminants may alter the effective resistance of the input resistor R8. In some instances, if one or more of the contacts 110 or 124 is corroded, the effective resistance $R_{EFF}$ 126 may be changed.

At 502, a first voltage is applied to a first contact 110(1) using a supply circuit 108 coupled between the first contact 110(1) and a second contact 110(2). As discussed above, the first voltage may be a zero-voltage signal. For example, one or more switches may couple the first contact 110(1) to an electrical ground. By coupling the first contact 110(1) to a ground, the first contact 110(1) may be safe from electrolytic corrosion and contact with metal of other devices will not result in sparking or short circuits that might damage components of the first device 102 or the second device 118. In an alternative implementation, the supply circuit 108 may be decoupled from the first contact 110(1), which may leave the first contact 110(1) floating. In another implementation, the supply circuit 108 may decouple the first contact 110(1) from the supply node 214 and may allow any voltage on the first contact 110(1) to dissipate through a resistor R14 to ground. Other implementations are also possible.

At 504, a second voltage is applied to a third contact 110(3). The second voltage may be a detection voltage to determine the effective resistance $R_{EFF}$ 126, which may include the input resistor R8 of the second device 118. For example, the detection circuitry 112 may apply the second voltage, through a voltage divider circuit 208 that includes a first resistor R7, a sense node 220, a capacitor C4, and a second resistor R12. The second voltage is applied to the third contact 110(3) via the resistors R7 and R12. The sense voltage VSENSE at the sense node 220 is proportional to the voltage at the third contact 110(3), which is applied across the input resistor R8. The sense voltage VSENSE may also be proportional to the effective resistance $R_{EFF}$ 126.

At 506, a sense voltage at a node is determined that is proportional to the second voltage. For example, the sense voltage may be determined at the sense node 220 that is within a voltage divider circuit 208. The voltage divider circuit 208 may include a first resistor R7 between a reference supply output node 218 and the sense node 220, a second resistor R12 between the sense node 220 and the third contact 110(3), and a third resistor (input resistor R8) within the second device 118. The sense voltage VSENSE is proportional to the voltage across the input resistor R8, which may be electrically coupled between the second contact 124(2) and the third contact 124(3). Additionally, the sense voltage VSENSE may be proportional to the effective resistance $R_{EFF}$ 126.

At 508, if the sense voltage VSENSE is less than a first threshold voltage (e.g., the low voltage threshold THL), the method includes continuing to apply the second voltage to the third contact 110(3). Then the method returns to 506 to determine, at the node, a sense voltage VSENSE that is proportional to the second voltage. The node may be the sense node 220 in the detection circuitry 112. Other implementations are also possible.

Returning to 508, if the sense voltage VSENSE is greater than or equal to the first threshold voltage, the sense voltage VSENSE is compared to a second threshold voltage at 510. The second threshold voltage may correspond to the high voltage threshold THH. If the sense voltage VSENSE at the sense node 220 is greater than the second threshold voltage (e.g., high voltage threshold THH), the sense voltage VSENSE is outside of the voltage range, and the method includes continuing to apply the first voltage to the first contact 110(1) and to apply the second voltage to the third contact 110(3). The method then includes determining the sense voltage at the node, at 506.

Otherwise, returning to 510, if the sense voltage is less than or equal to the second threshold, a third voltage is applied to the first contact 110(1), at 512. In some implementations, the third voltage may be a power supply or recharge voltage to drive a load 120 of the second device 118 when it is electrically coupled to the first contact 110(1), the second contact 110(2), and the third contact 110(3). The third voltage may be greater than the first voltage and the second voltage.

While the method described with respect to FIG. 5 applies voltages to the first contact 110(1) and the third contact 110(3), it should be appreciated that the supply circuit 108 may apply a first current and a second current, instead. The second contact 110(2) may be coupled to a ground to provide a return path for current flow. In some implementations, the first voltage may be a zero-voltage signal, a low voltage signal below approximately 100 mV, or another voltage signal that is sufficiently small that is does not result in corrosion of the contacts 110 in the presence of moisture. In some implementations, the application of a voltage to the first contact 110(1) may be controlled by a switching circuit that couples one of a power supply bus or an electrical ground to the contact 110(1). In other implementations, the supply circuit 108 may decouple the first contact 110(1) from the supply node 214, allowing any voltage at the first contact 110(1) to dissipate. Other implementations are also possible.

The circuitry described above with respect to FIGS. 1-4 and the method described with respect to FIG. 5 may be implemented in a variety of form factors. One form factor for the first device 102 may be a docking system that includes a dock with a clamping mechanism and various features that mechanically retain the second device 118 while establishing a persistent electric connection between the contacts 110 of the first device 102 and the contacts 124 of the second device 118. The dock or first device 102 may be designed to engage a second device 118 with a wide range of external shapes, including various curves, bands, and so forth. An example of an implementation of the first device 102 is described below with respect to FIG. 6.

Illustrative System

Figure 6:
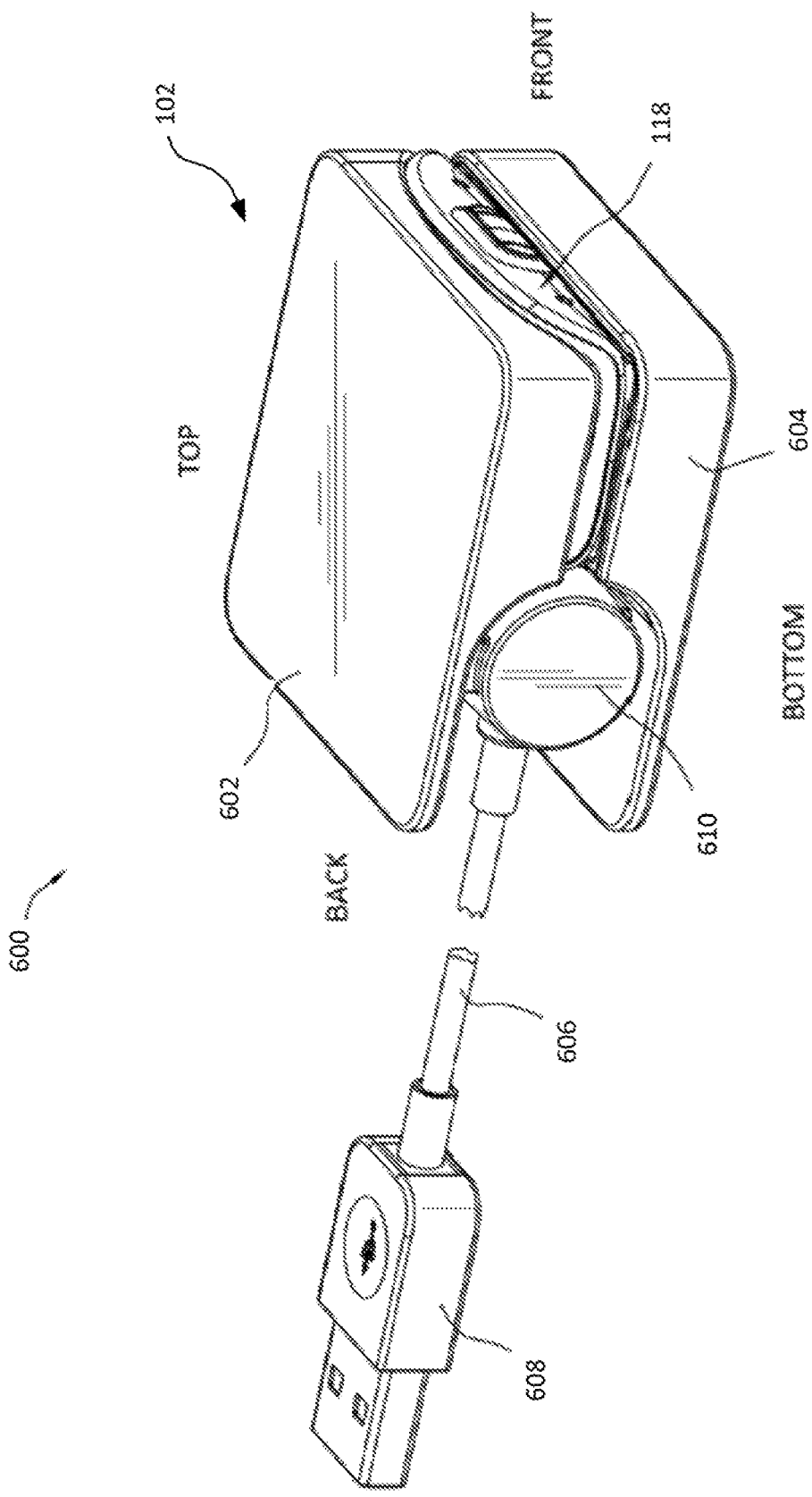
FIG. 6 depicts a dock device with a clamp in a closed position to secure a wearable device and including a detection circuit to detect a resistance within a predetermined range before applying a power supply, according to one implementation.

FIG. 6 illustrates a dock device 600 (dock), according to one implementation. The dock 600 represents one implementation of the first device 102 of FIGS. 1-5. The dock 600 comprises a first section 602 and a second section 604. A cable 606 extends from the second section 604 and is terminated with a connector 608. For example, the connector 608 may comprise a universal serial bus (USB) type "A" plug. In some implementations visible indicia may be present on one or more of the first section 602 or the second section 604. For example, a logo may be printed on an upper surface of the first section 602, allowing a user to more easily determine the orientation of the dock 600. In other implementations other indicia may be presented. For example, the exterior shape of a portion of the first section 602 may be rounded or extend upwards, providing a visual and tactile indication of the orientation of the dock 600. In another example, the outer surface of the first section 602 may be smooth while the outer surface of the second section 604 that would come into contact with a surface upon which the dock 600 rests during use may comprise an elastomeric or nonskid material.

A hinge 610 joins the first section 602 and the second section 604 and defines an axis about which the first section 602 pivots relative to the second section 604. The hinge 610 allows the first section 602 and the second section 604 to move relative to one another about a pivot defined by the hinge 610. A biasing mechanism, such as a spring, a magnet, a coil, or another biasing mechanism may provide a force to bias the first section 602 toward the second section 604. The biasing force serves to bring a first front portion of the first section 602 towards a second front portion of the second section 604 to close about a second device 118.

In the implementation depicted here, the hinge 610 includes the biasing mechanism, such as a spring, that applies the biasing force. In another implementation the biasing mechanism may be separate from the hinge 610. For example, a first magnet may be affixed to the first section 602 and a second magnet may be affixed to the second section 604. Attraction between the two magnets may operate as the biasing mechanism and provide the biasing force.

An external force may be applied to open the dock 600, increasing the distance between the first front portion of the first section 602 and the second front portion of the second section 604. For example, a user may press down on a first back portion of the first section 602 that is located behind the hinge 610, causing the first section 602 to pivot about the axis defined by the hinge 610 to open relative to the second section 604. In another example, the user may pinch, applying pressure simultaneously and in opposite directions to the first back portion of the first section 602 and a second back portion of the second section 604 that is located behind the hinge 610. This pinching action may also cause the dock 600 to open. When the external force is removed, the biasing mechanism closes the dock 600, pivoting the first section 602 and the second section 604 toward one another about the axis defined by the hinge 610.

In this illustration, the second device 118 (an electronic device) is depicted within the dock 600. One implementation of the second device 118 is described in more detail with regard to FIG. 7. In the closed configuration shown here, the biasing force from the biasing mechanism is transferred mechanically from the first section 602 to a top surface of the second device 118. Likewise, the biasing force from the biasing mechanism is transferred mechanically from the second section 604 to a bottom surface of the second device 118. The dock 600 thus clamps or applies pressure to the second device 118, affirmatively maintaining the second device 118 within the dock 600. Because the first section 602 and the second section 604 may be moved relative to one another under the urging of the biasing mechanism, the dock 600 is able to accommodate different configurations of the second device 118. For example, the second device 118 may comprise a wearable device that is retained against a user during wear with a band. The dock 600 may accommodate the band (not shown) by providing clearance for the band between the first section 602 and the second section 604 while the second device 118 is in the dock 600.

The dock 600 may also be able to accommodate different models of the second device 118. For example, overall thickness of different models may vary or the external shape of a housing of different models may vary. Because the first section 602 and the second section 604 may be moved relative to one another under the urging of the biasing mechanism, the dock 600 is able to accommodate these variations. This allows the dock 600 to be used with different second devices 118.

In some implementations, the supply circuit 108 and the detection circuitry 112 may be included within the second section 604. The supply circuit 108 may couple electrical contacts to an electrical ground in a default state. The detection circuitry 112 may apply a detection voltage to a contact and may monitor a sense voltage that is proportional to the detection voltage to determine if the effective resistance $R_{EFF}$ 126 is within an expected range, based on the sense voltage VSENSE. If the effective resistance $R_{EFF}$ 126 is within an expected range, the detection circuitry 112 may trigger the supply circuit 108 to provide a supply voltage to the second device 118. If the effective resistance $R_{EFF}$ 126 is outside of the expected range, the detection circuitry 112 may turn off the supply circuit 108 or may maintain the supply circuit 108 in an off state. Alternatively, the detection circuitry 112 may decouple the supply circuit 108 from the second device 118.

Figure 7:
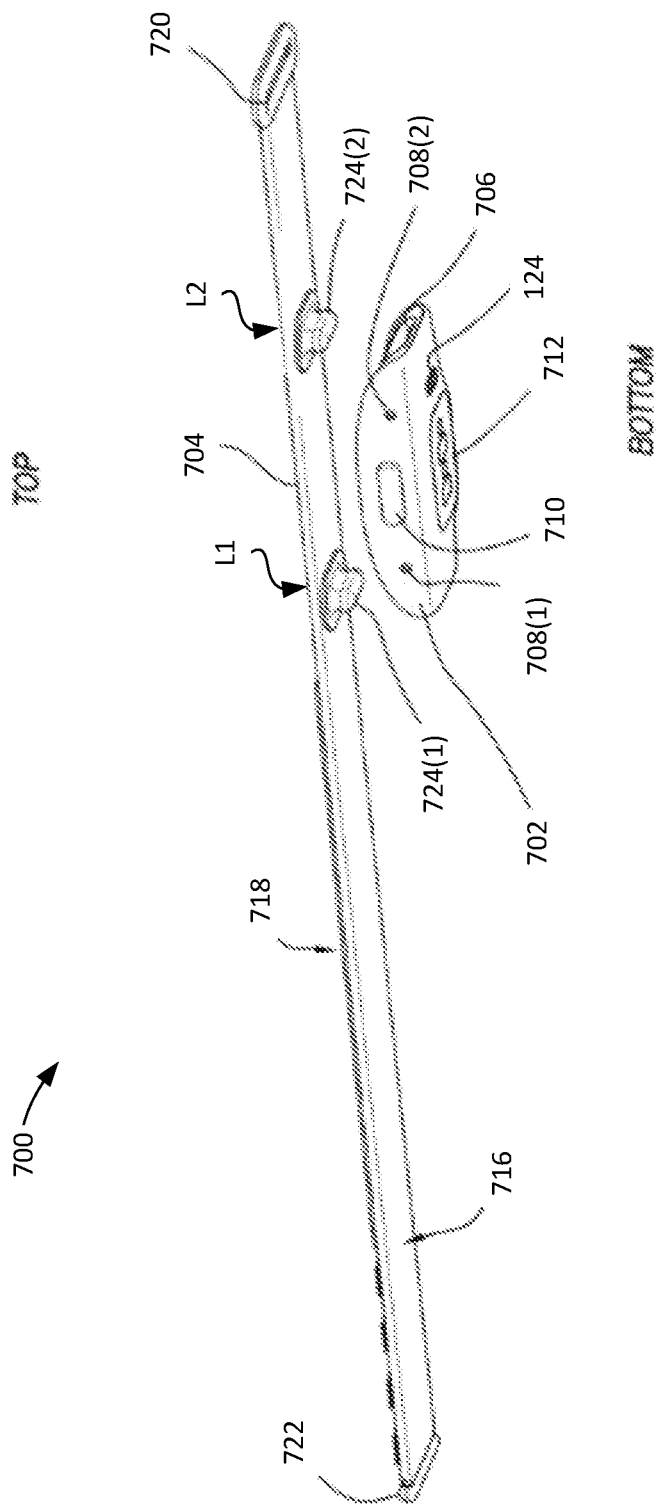
FIG. 7 is an illustrative wearable device that may be retained by the dock, according to one implementation.

FIG. 7 depicts one form factor 700 of a second device 118 that may be retained by the dock 600, according to one implementation. For example, the dock 600 may be used to provide electrical power that charges a rechargeable battery within the second device 118.

The second device 118 may comprise a wearable device with a housing 702 and a band 704. The housing 702 may comprise a body and an upper cover (not visible). The body, upper cover, and other components may comprise one or more of a metal, plastic, composite, ceramic, and so forth.

The body may include one or more openings. For example, during assembly components may be placed within the body through an opening that is then closed by the upper cover. The body and the upper cover may be joined such that the resulting housing 702 is sealed. The housing 702 may be sealed to secure the components and to protect the components from the environment. In the implementation shown here, a top surface of the housing 702 is curved. During wear, the top surface of the housing 702 faces away from a portion of the user to which the second device 118 is retained. A bottom surface of the housing 702 is proximate to the portion of the user. For example, at least a portion of the bottom surface of the housing 702 may be in contact with the user while the second device 118 is being worn.

The body of the housing 702 may include one or more receptacles 706. As illustrated here, the body has two ends and is generally rectangular when viewed from above. In the illustrated example, a first receptacle 706 is proximate to a first end of the body while a second receptacle 706 is proximate to a second end of the body. Each receptacle 706 has an opening on the top surface of the housing 702. For example, the receptacle 706 may be within the body while the upper cover includes apertures for each of the openings of the receptacles 706.

Each receptacle 706 is configured such that the opening or entry to the receptacle 706 is smaller along at least one dimension than an interior volume of the receptacle 706. For example, each receptacle 706 may include a retention ridge that is proximate to the opening in the receptacle 706. The retention ridge introduces a constriction or narrowing. For example, in cross-section the receptacle 706 may appear to resemble a mushroom shape with a root or stalk that is narrower than a larger, bulbous tip. In some implementations the retention ridge may extend along the entire perimeter of the opening.

The housing 702 may include one or more apertures 708. The body may include several apertures 708 for microphone ports, light emitting diodes, air pressure sensors, and so forth. In this view, apertures 708(1) and 708(2) are shown on a first side of the housing 702. For example, the aperture 708(1) may comprise a pressure equalization port and the aperture 708(2) may provide a port for a microphone to receive sound from outside the housing 702. Additional apertures 708 may be included on the other side of the housing 702.

A button 710 is also present on the first side of the housing 702 between the apertures 708(1) and 708(2). The button 710 may be used to activate a switch to allow for user input. The button 710 may extend away from a side of the housing 702. In the event of a misalignment of the second device 118 within the dock 600 (relative to the contacts 110), at least a portion of a second feature 806 (shown in FIG. 8) would come into contact with at least a portion of the button 710 or associated portion of the housing 702. The obstruction posed by the second feature 806 may prevent insertion of the second device 118 in an improper orientation or in a misalignment.

A sensor window 712 is arranged on a surface of the housing 702. The sensor window 712 may be transparent to one or more wavelengths of light. For example, the sensor window 712 may be transparent to visible and infrared light. The sensor window 712 may be used by one or more sensors to obtain information about the user. A field of view of one or more sensors may pass through the sensor window 712. For example, an optical heart rate monitor may comprise a light emitting diode (LED) or other light source that emits light which passes through the sensor window 712 and to the arm of the user. Reflected or scattered light returns through the sensor window 712 where it is measured by a photodetector. In another example a camera may have a field of view that passes through the sensor window 712 to obtain images of a portion of the user's arm.

In some implementations, the portion of the surface of the housing 702 that includes the sensor window 712 may protrude away from the remainder of the bottom surface, as shown here.

One or more electrical contacts 124 may also be present on the bottom surface of the housing 702. The electrical contacts 124 may be used to transfer data, provide electrical power, and so forth. In some implementations the electrical contacts 124 may be recessed with respect to the bottom surface of the second device 118. In other implementations the electrical contacts 124 may be flush with or extend slightly from the bottom surface of the second device 118. When the second device 118 is installed in the dock 600 in the proper orientation, the electrical contacts 110 of the dock 600 come into contact with corresponding electrical contacts 124 in the second device 118.

The band 704 may comprise a flexible member having a first end and a second end. The flexible member includes an inner surface 716 and an outer surface 718. When the band 704 is affixed to the housing 702, at least a part of the inner surface 716 of the flexible member is proximate to the top surface of the housing 702.

The flexible member may comprise one or more of fabric, an elastomeric material, a plurality of links, and so forth. For example, the flexible member may comprise an elastic fabric. A loop 720 may be arranged at the first end of the flexible member while an endcap 722 may be arranged at the second end. The loop 720 may be a rigid loop. For example, the loop 720 may comprise metal that is encased in plastic. In other implementations, the loop 720 may comprise a flexible material. In still other implementations, the loop 720 may comprise a semi-rigid material that is less flexible than the flexible member but that still has some elasticity for user comfort. The loop 720 may thus retain or capture the end cap 722.

One or more protrusions 724 extend away from the inner surface of the flexible member. In the implementation shown here, a first protrusion 724(1) extends from the inner surface of the flexible member at a first location L1 and a second protrusion 724(2) extends from the inner surface at a second location L2.

Each protrusion 724 is configured to maintain mechanical engagement after insertion into the receptacle 706. A portion of each protrusion 724 is larger than the narrowest part of the opening into the receptacle 706. The protrusions 724 may comprise an elastomeric material. In one implementation, the protrusions 724 may comprise silicone rubber having a hardness as measured using a durometer with a Shore A reading of between 70 and 90.

Each protrusion 724 is aligned to a respective receptacle 706 and a force is applied to the flexible member on the outer surface opposite the protrusion 724. The applied force causes the enlarged portion of the protrusion 724 to temporarily deform, allowing it to pass into the cavity of the receptacle 706. Once within the receptacle 706, the elastomeric material expands, securing part of the protrusion 724 within the receptacle 706. The band 704 is now affixed to the housing 702.

With the housing 702 and the band 704 attached, the second device 118 may be worn by a user. The flexible member may include on the outer surface 718 a loop portion comprising a plurality of loops and a hook portion comprising a plurality of hooks. To affix the second device 118 to the user, the second end of the flexible member having the endcap 722 is passed through the loop 720. The user may place their forearm into the loop formed by the flexible member. The second end of the flexible member may then be pulled such that the inner surface is in comfortable contact with the user's forearm, and the hook portion is then pressed against the loop portion, securing the flexible member.

In other implementations, other mechanisms may be used to secure the second device 118 to the user. For example, the flexible member may utilize a buckle, a folding clasp, butterfly closure, and so forth. In another example, the flexible member may comprise a contiguous loop of elastomeric material, allowing the user to pass their hand through the loop which then contracts to hold the second device 118 in place.

In some implementations the housing 702 may include one or more output devices on the top surface. For example, a display device may be arranged on the top surface between the receptacles 706 to provide visual output to the user. At least a portion of the flexible member that is between the first location L1 and the second location L2 may be transparent, contain one or more holes, or another opening to allow at least a portion of the display device to be visible. For example, the flexible member may comprise a transparent material such as silicone rubber. In another example, the flexible member may comprise an opening or aperture that is coincident with the display device. In another example, the flexible member may comprise a plurality of holes, perforations, or spaces between threads that allow at least a portion of light from the display device to pass through.

In other implementations the dock 600 may be modified to operate in conjunction with second devices 118 of other external shapes. For example, the size and profiles of one or more recesses and features of the dock 600 may be varied to fit other form factors of second devices 118.

Figure 8:
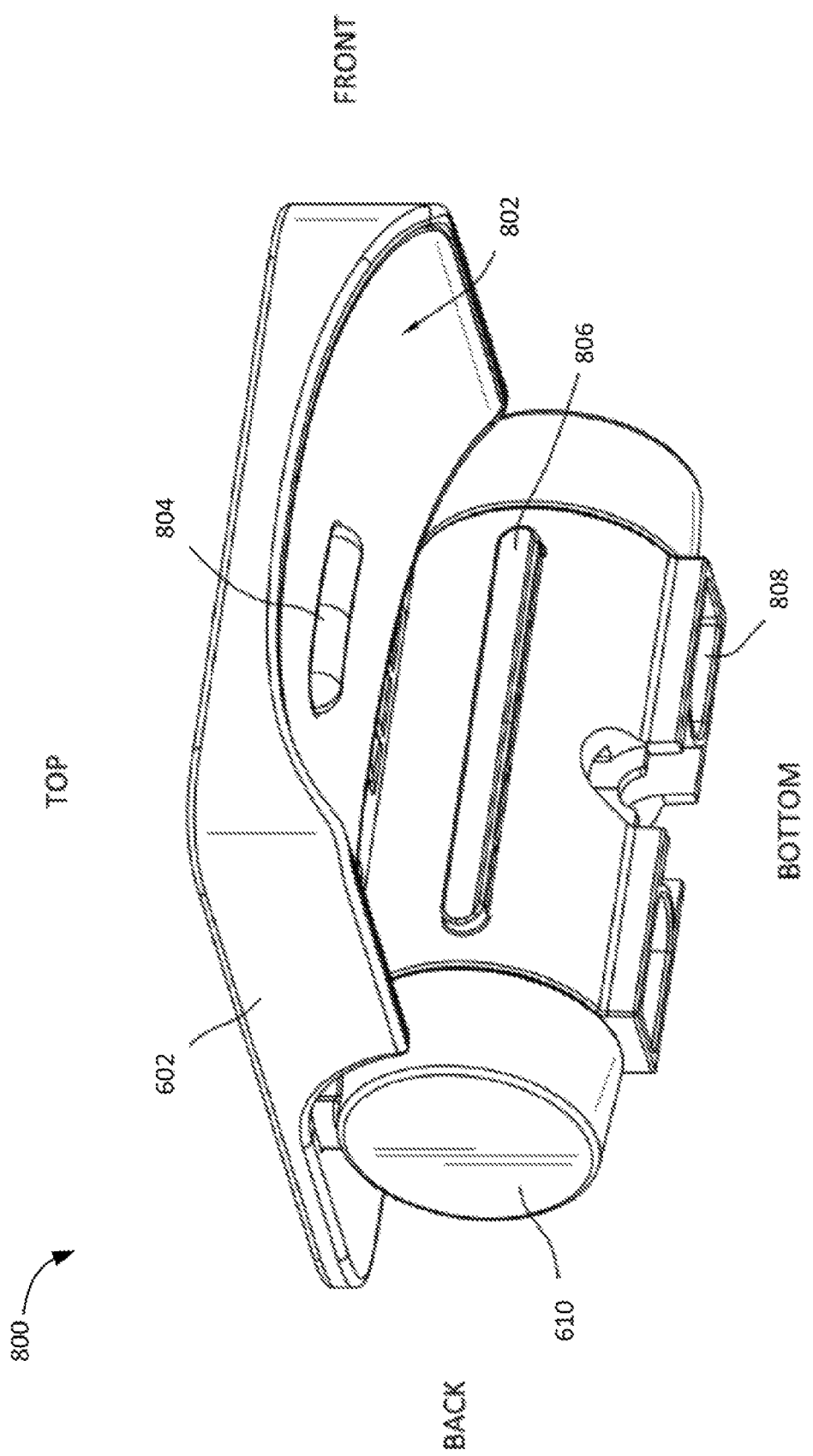
FIG. 8 depicts a first section of the dock device which includes a contact feature in a first recess and a key feature extending from a hinge assembly, according to one implementation.

FIG. 8 depicts the first section 602 of the dock 600 and the hinge 610, according to one implementation. In this view, a first recess 802 in the first section 602 opens downwards or generally toward the second section 604 (shown in FIGS. 6 and 9). The first recess 802 may be generally concave, with the concavity opening downwards or towards the second section 604. The overall shape of the first recess 802 is configured to fit or accommodate at least a portion of a top of the second device 118 when the second device 118 is present.

The interior of the first recess 802 comprises a first inner surface. One or more features 804 may extend away from the first inner surface. In the implementation depicted here, a first feature 804 comprises a ridge that extends away from the first inner surface. The first feature 804 is arranged in a linear ridge having a long axis that is parallel to a long axis of the first recess 802. For example, the linear ridge of the first feature 804 extends from left to right with respect to the dock 600. In other implementations one or more other types of features 804 may be used. For example, the first feature 804 may comprise a hemisphere or dome that extends away from the first inner surface. Other shapes may also be included to direct the second device 118 toward the second section 604 and to bias the contacts 124 against the contacts 110 to secure and maintain an electrical connection.

In some implementations the one or more features 804 may comprise an elastomeric material. For example, the elastomeric material may comprise a silicone rubber. During use, the biasing force provided by the biasing mechanism is transferred from the first section 602 to the one or more features 804 to a top surface of the second device 118.

Also shown is a second feature 806 that extends away from a body of the hinge 610. The second feature 806 is located between the first recess 802 and a second recess in the second section 604. The second feature 806 may comprise a linear ridge having a long axis that is parallel to a long axis of the first recess 802. The linear ridge may extend from proximate to a left end of the body of the hinge 610 to proximate to a right end of the hinge 610. In other implementations, the second feature 806 may comprise other shapes or arrangements. For example, the second feature 806 may comprise a hemisphere. In another example, a plurality of features 806 may be used.

The second feature 806 extends towards the front of the dock 600. The size and placement of the second feature 806 is configured to complement the external shape of the second device 118. The second feature 806 may enforce a particular orientation of the second device 118 with respect to the dock 600 during use. For example, the second feature 806 may be sized so as to not obstruct the second device 118 when the second device 118 is properly oriented with regard to the dock 600, but if incorrectly installed the second feature 806 may mechanically obstruct and prevent the second device 118 from being seated in the dock 600. Continuing the example, the second device 118 may have a button 710 on a first side to accept user input. In the proper orientation the button 710 may be visible at the front of the dock 600, while an improper orientation may place the button 710 towards the back of the dock 600. This obstruction provided by the interaction of the button 710 on the second device 118 and the second feature 806 in the improper orientation prevents proper seating of the second device 118 with respect to the dock 600. This provides immediate and apparent feedback to the user that the second device 118 is improperly oriented, allowing the user the opportunity to move and reorient the second device 118 to the proper alignment. Once properly aligned, the dock 600 may establish an electric connection with the second device 118 to allow for charging, data transfer, and so forth.

It should be appreciated that the power supply circuit 108 and the detection circuitry 112 may be positioned within the second section 604 of the dock 600 and may detect the alignment of the second device 118 based on the detected sense voltage. The power supply circuit 108 may couple the contacts 110 to an electrical ground or may decouple the contacts 110 from any voltage supply when the second device 118 is not coupled to the dock 600. The detection circuitry 112 may apply a detection voltage to the contact 110(3) and may monitor a sense voltage VSENSE to determine an effective resistance R$_{EFF}$ 126. While the effective resistance R$_{EFF}$ 126 remains outside of a predetermined range as determined by the sense voltage VSENSE being out of a voltage range, the detection circuitry 112 communicates with the supply circuit 108 to maintain the contacts 110 in a de-energized state. When the detection circuitry 112 determines that the sense voltage VSENSE is within the voltage range, the effective resistance R$_{EFF}$ 126 is within the expected range and the detection circuitry 112 provides a control signal to the supply circuit 108 triggering the supply circuit 108 to provide a supply voltage to the contact 110(1) to provide power to the second device 118.

As discussed above, if the second device 118 is incompatible with the dock 600 or if a resistance R8 of the second device 118 is different from an expected resistance, the detection circuitry 112 may determine that the effective resistance R$_{EFF}$ 126 is out of an expected range based on the sense voltage VSENSE. Alternatively, if the effective resistance R$_{EFF}$ 126 changes to be out of the expected range, the detection circuitry 112 may send a control signal 116 to the supply circuit 108 to de-energize the contacts 110, to shut off the power supply, to couple the contacts 110 to an electrical ground, or any combination thereof.

The hinge 610 may include one or more mounting features 808 that facilitate joining the hinge 610 to the second section 604. The hinge 610 may be joined to one or more of the first section 602 or the second section 604 using various techniques. For example, mechanical fasteners, mechanical interference fits, adhesives, welding, and so forth may be used to join the first section 602 and the second section 604 to the hinge 610. In another implementation the hinge 610 may comprise a living hinge and at least a portion of the first section 602 and the second section 604 may be a unitary piece.

A first front section extends from a line through a long axis of the hinge 610 towards a front of the first section 602. A first back section extends from the line towards a back of the first section 602.

Figure 9:
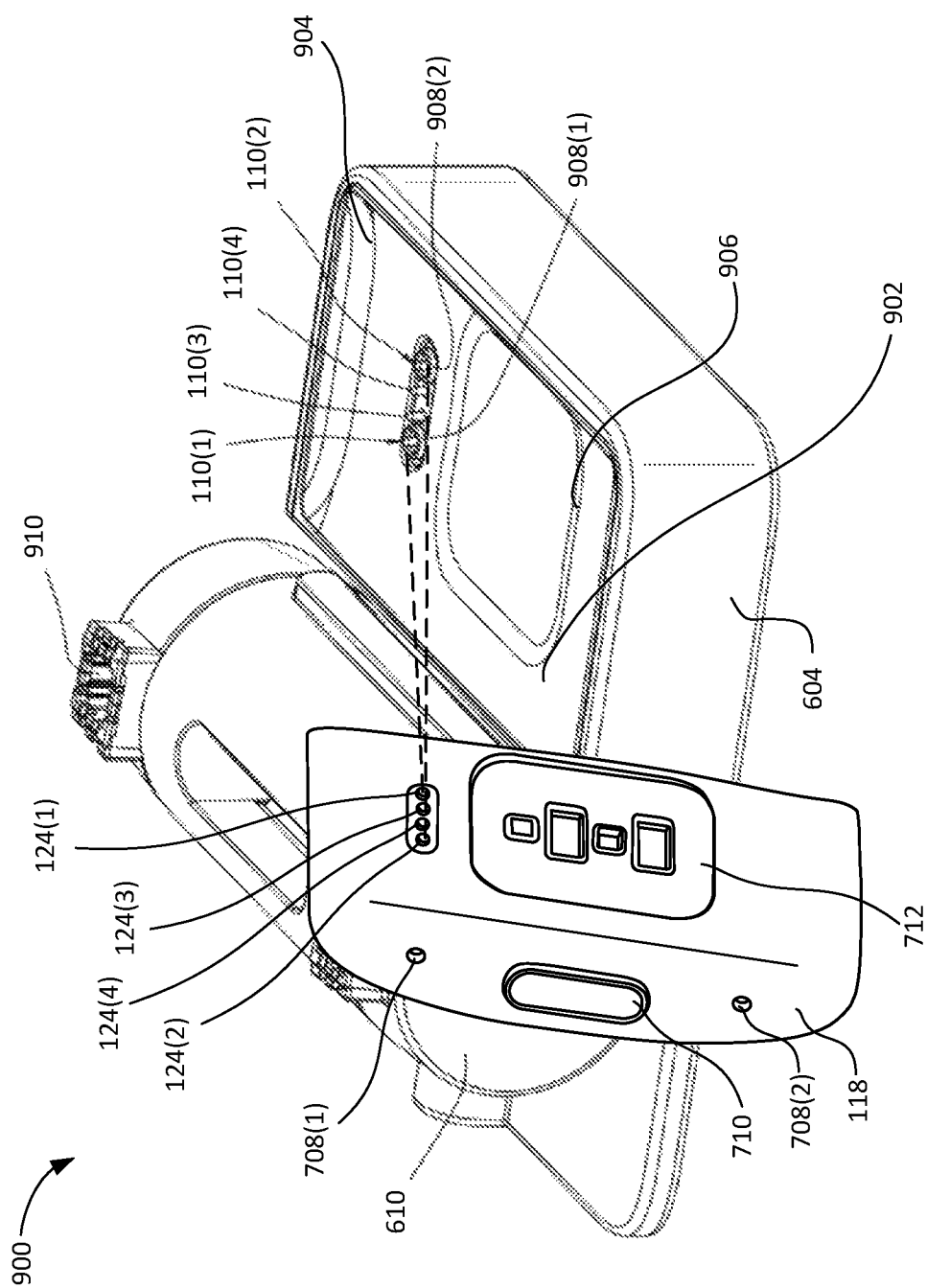
FIG. 9 depicts a perspective view of a wearable device and a portion of the dock including contacts for charging and for detection, according to one implementation.

FIG. 9 depicts the second section 604 of the dock 600, according to one implementation. The second section 604 may comprise a second recess 902. The second recess 902 may be generally concave, with the concavity opening upwards or towards the first section 602. The overall shape of the second recess 902 is configured to fit or accommodate at least a portion of a bottom of the second device 118 when the second device 118 is present.

The interior of the second recess 902 comprises a second inner surface. One or more lips 904 or edges may be present around at least a portion of the perimeter of the second recess 902. For example, a first lip 904 may be present at a first end of the second recess 902 and a second lip 904 may be present at a second end of the second recess 902 as shown here. The lips 904 may constrain lateral movement of the second device 118 when the second device 118 is present. For example, the first lip 904 and the second lip 904 may come into contact with a ridge or other feature on the second device 118, preventing the second device 118 from slipping left or right while the dock 600 is closed.

A third recess 906 or another feature may be present within the second inner surface of the second recess 902. For example, the third recess 906 may accommodate a bottom portion of the second device 118.

One or more electrical contacts 110(1)-(4) are present in the second recess 902. In the implementation depicted here, there are two electrical contacts 110 arranged between a first edge of the third recess 906 and a first end of the second recess 902. The one or more electrical contacts 110 may comprise pogo pins that extend through the second inner surface. The pogo pin includes a spring-biased contact which comes into contact with a corresponding pad or electrical contact 124 on the second device 118 when the second device 118 is present. The end of the pogo pin or other electrical contact 110 may extend beyond the second inner surface. For example, when uncompressed, the pin in the pogo pin may be "proud" or extend slightly above the second inner surface and into the second recess 902.

In one implementation the electrical contact 110(2) that is closest to a front edge of the second section 604 may be connected to an electrical ground. In this implementation, during insertion of the second device 118, the second device 118 may come into contact with the electrical ground first, grounding the second device 118 to the dock 600 or the electronics therein. This grounding may reduce the likelihood of arcing during insertion of the second device 118. The contact 110(1) may also be coupled to ground in a first state.

One or more elastomeric features 908 may be arranged around one or more of the electrical contacts 110. For example, a first elastomeric feature 908(1) comprising a ring of elastomeric material may be centered around a first contact 110(1), and a second elastomeric feature 908(2) may be centered around a second contact 110(2). While a ring is shown, in other implementations other shapes may be used. For example, a linear feature may be arranged between the contacts 110, having a long axis perpendicular to a line through the contacts 110 and extending beyond the second inner surface. The elastomeric features 908 may cooperate to prevent the second device 118 from sliding across the contacts 110.

During use of the dock 600, the biasing force from the biasing mechanism pushes the bottom surface of the second device 118 into the elastomeric feature(s) 908, securing the second device 118.

The hinge 610 may include one or more mounting features 910 that facilitate joining the hinge 110 to the first section 602.

Also visible is the second feature 806 that extends away from a body of the hinge 610.

A second front section extends from a line through a long axis of the hinge 610 towards a front of the second section 604. A second back section extends from the line towards a back of the second section 604.

In the illustrated example, the second section 604 of the dock 600 has four electrical contacts 110(1)-(4), compared to the three electrical contacts 110(1), 110(2), and 110(3) shown in FIGS. 1-2. In some implementations additional electrical contacts 110 may be included to provide increased power transfer, for data communication, and so forth. Shown here are a first contact 110(1), a second contact 110(2), a third contact 110(3), and a fourth contact 110(4). A first elastomeric feature 908(1) is arranged around the first contact 110(1). A second elastomeric feature 908(2) is arranged around the second contact 110(2). The third contact 110(3) and the fourth contact 110(4) may be provided with or without elastomeric features.

In the illustrated example, the contacts 110 are arranged in a linear arrangement. For example, contacts 110(1), 110(2), 110(3), and 110(4) are arranged in a line. In other implementations, other configurations and other arrangements may be used.

In this implementation the elastomeric features 908 are not present on the contacts 110(3) and 110(4). In other implementations, one or more of the electrical contacts 110(1) and 110(2) may have a corresponding elastomeric feature 908.

In the illustrated example, the second device 118 is shown that includes a corresponding arrangement of contacts 124(1), 124(2), 124(3), and 124(4), which can be aligned with and electrically coupled to the contacts 110(1), 110(2), 110(3), and 110(4), respectively. The second device 118 may be placed onto the second recess 902, and the contacts 124 may be aligned with the contacts 110 of the dock 600.

In this example, the supply circuit 108 may couple the first contact 110(1) to an electrical ground in a default state, and the detection circuitry 112 within the second section 604 may apply a detection signal, such as a voltage less than 100 mV, to the third contact 110(3). The detection circuitry 112 may determine a sense voltage proportional to a voltage at the third contact 110(3) and may determine if the sense voltage is within a voltage range. The sense voltage may be proportional to a voltage across an effective resistance $R_{EFF}$ 126 that includes the contact resistances of the contacts 110 and 124, parasitic resistances, the resistance of the resistor R8 within the second device 118, or any combination thereof. If the sense voltage VSENSE is within the voltage range, the detection circuitry 112 may trigger a supply circuit 108 to apply a second signal, such as a supply-voltage, to the first contact 110(1). The second voltage signal may be an operating voltage to power the second device 118 or to drive a load 120, such as by recharging a battery or another charge storage device. If the sense voltage VSENSE is outside of the voltage range, the detection circuitry 112 may trigger the supply circuit 108 to couple the first contact 110(1) to an electrical ground, to decouple the first contact 110(1) from a supply bus, or both.

It should be appreciated that the contacts 110 of the dock 600 and the contacts 124 of the second device 118 are shown for illustrative purposes and are not intended to be limiting. For example, the designation of first, second, third, and fourth is not intended to indicate any specific ordering or sequence of the contacts, but rather to provide clarity in the description. Accordingly, any of the contacts 110 of the first device 102 and any of the contacts 124 of the second device 118 may provide the functionality described herein, provided the respective pins are aligned to provide the electrical connections.

Embodiments of a circuit are described above that may include a first contact 110(1), a second contact 110(2) coupled to a ground, and a third contact 110(3). The circuit may include a supply circuit 108 coupled to the first contact 110(1) and the second contact 110(2). The circuit may include detection circuitry 112 coupled to the second contact 110(2) and the third contact 110(3).

The detection circuitry 112 may apply a detection voltage to the third contact 110(3), determine a sense voltage proportional to the detection voltage, and compare the sense voltage to a voltage range. If the sense voltage is outside of the voltage range, the detection circuitry 112 may send a first control signal 116 to the supply circuit 108 to decouple the first contact 110(1) from a supply voltage and optionally to couple the first contact 110(1) to an electrical ground. If the sense voltage is within the voltage range, the detection circuitry 112 may send a second control signal 116 to the supply circuit 108 to decouple the first contact 110(1) from the ground and to couple the first contact 110(1) to a supply bus. A timing circuit may delay the second control signal by a period of time corresponding to a resistor-capacitor time constant to avoid false detection of the second device 118. Other implementations are also possible.

Specific physical embodiments as described in this disclosure are provided by way of illustration and not necessarily as a limitation. For example, circuit elements may be combined or additional circuit components may be added without departing from the present disclosure.

Processes discussed herein may be implemented in hardware, software, or a combination thereof. In the context of software, the described operations represent computer-executable instructions stored on one or more non-transitory computer-readable storage media that, when executed by one or more processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Additionally, those having ordinary skill in the art will readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. A device comprising:
   a supply circuit coupled to a first contact and a second contact;
   a detection circuit coupled to the second contact and a third contact, the detection circuit comprising:
   a reference supply circuit to apply a reference voltage to a first output;
   a first voltage divider circuit including a first input coupled to the first output of the reference supply circuit and including a first output of the first voltage divider circuit to provide a first reference voltage, the first voltage divider circuit including a first capacitor between the first output of the first voltage divider circuit and a power supply conductor;
   a second voltage divider circuit including a second input coupled to the first output of the reference supply circuit and including a second output of the second voltage divider circuit to provide a second reference voltage, the second voltage divider circuit including a second capacitor between the second output and the power supply conductor;
   a third voltage divider circuit including a third input coupled to the first output of the reference supply circuit, a third output to provide a sense voltage, and a fourth output coupled to the third contact, the third voltage divider circuit includes a third capacitor between the third output and the power supply conductor;
   a first comparator including a first comparator input coupled to the third output to receive the sense voltage, a second comparator input coupled to the first output of the reference supply circuit to receive the first reference voltage, and a first comparator output to provide a first output signal indicating the sense voltage is greater than the first reference voltage;
   a second comparator including a third comparator input coupled to the second output to receive the second reference voltage, a fourth comparator input coupled to the third output to receive the sense voltage, and a second comparator output to provide a second output signal indicating the sense voltage is less than the second reference voltage; and
   a shutoff circuit coupled to the first comparator output and the second comparator output, the shutoff circuit to provide a control signal to the supply circuit to provide one of a first supply voltage or a second supply voltage to the first contact in response to the first output signal and the second output signal.

2. The device of claim 1, wherein:
the first comparator output and the second comparator output are coupled to a node that is coupled to the shutoff circuit; and
the detection circuit further comprises:
a resistor coupled between the first output of the reference supply circuit and the node;
a fourth capacitor including a first conductor coupled to the node and including a second conductor coupled to the power supply conductor;
wherein the resistor and the fourth capacitor provide a time constant to delay the control signal from the shutoff circuit to turn on the supply circuit; and
wherein the detection circuit provides the control signal from the shutoff circuit to turn off the supply circuit independent of the time constant.

3. The device of claim 1, wherein the detection circuit further comprises a light-emitting diode coupled to the shutoff circuit, the light-emitting diode to illuminate in response to the control signal indicating the sense voltage is less than a first voltage threshold or greater than a second voltage threshold.

4. A system comprising:
a first device comprising:
a first contact;
a second contact;
a third contact; and
a first circuit coupled to the first contact, the second contact, and the third contact, the first circuit to:
determine a sense voltage from a sense node between a supply voltage and the third contact;
determine, based on the sense voltage, that a second device is coupled to the first contact, the second contact, and the third contact;
determine the sense voltage is within a predetermined range; and
couple a supply voltage to the first contact.

5. The system of claim 4, further comprising:
the second device comprising:
a second circuit comprising:
a fourth contact to establish an electrical connection with the second contact;
a fifth contact to establish an electrical connection with the third contact; and
a detection resistor between the fourth contact and the fifth contact.

6. The system of claim 4, wherein the first circuit comprises:
a first comparator including a first input to receive the sense voltage related to a voltage at the third contact, a second input to receive a first reference voltage, and a first comparator output coupled to a comparator output node to provide a first output signal; and
a second comparator including a third input to receive a second reference voltage, a fourth input to receive the sense voltage, and a second comparator output coupled to the comparator output node to provide a second output signal;
wherein a first voltage level at the comparator output node is indicative of the sense voltage within the predetermined range; and
wherein a second voltage level at the comparator output node is indicative of the sense voltage outside of the predetermined range.

7. The system of claim 4, wherein the first circuit comprises:
a comparator circuit including a comparator output to provide an output signal indicative of the sense voltage; and
a shut off circuit coupled to the comparator output, the shut off circuit to receive the output signal from the comparator circuit and, in response to the output signal, to provide the supply voltage to the first contact.

8. The system of claim 7, wherein the first circuit further comprises:
a resistor coupled between the supply voltage and an output of the comparator circuit;
a capacitor including a first conductor coupled to the output of the comparator circuit and including a second conductor coupled to a power supply conductor;
wherein the resistor and the capacitor provide a time constant to delay providing of the supply voltage to the first contact; and
wherein the output of the comparator circuit enables the shut off circuit to decouple the supply voltage from the first contact independent of the time constant.

9. The system of claim 4, wherein the first circuit further comprises:
a power supply to provide a supply voltage to a first conductor;
a first voltage divider circuit including a first resistor, a sense node to provide the sense voltage, a first capacitor, and a second resistor, the first resistor coupled between the first conductor and the sense node, the first capacitor coupled between the sense node and an electrical ground, the second resistor coupled between the sense node and the third contact;
a second voltage divider circuit including a second input coupled to the first conductor and including a first output to provide a first reference voltage, the second voltage divider circuit including a second capacitor coupled between the first output and the electrical ground; and
a third voltage divider circuit including a third input coupled to the first conductor and including a second output to provide a second reference voltage, the third voltage divider circuit including a third capacitor coupled between the second output and the electrical ground.

10. The system of claim 4, wherein the first circuit further comprises:
a power supply to provide a supply voltage to a first conductor;
a first voltage divider circuit comprising:
a first resistor coupled between the first conductor and a first node;
a first capacitor coupled between the first node and an electrical ground;
a second resistor coupled between the first node and a first output; and
a second voltage divider circuit comprising:
a third resistor between the first output and the sense node;
a second capacitor coupled between the sense node and the electrical ground; and
a fourth resistor coupled between the sense node and the third contact.

11. The system of claim 4, wherein the first circuit further comprises:
- a first comparator including a first input to receive the sense voltage, a second input to receive a first reference voltage, and a first comparator output to provide a first signal indicative of a voltage level of the sense voltage relative to the first reference voltage;
- a second comparator including a third input to receive the sense voltage, a fourth input to receive a second reference voltage, and a second comparator output to provide a second signal indicative of the voltage level of the sense voltage relative to the second reference voltage; and
- a shutoff circuit including a low dropout regulator including an enable input coupled to the first comparator output and the second comparator output and including an output coupled to the first contact, the low dropout regulator to provide the supply voltage to the first contact in response to a voltage level at the first comparator output and the second comparator output being greater than an enable voltage threshold level.

12. A method comprising:
- decoupling a supply voltage from a first contact of a first device using a first circuit, the first device including the first contact, a second contact, and a third contact;
- applying a voltage to the third contact of the first device using the first circuit;
- determining a sense voltage from a node within a first voltage divider circuit using the first circuit, the sense voltage being proportional to the voltage at the third contact;
- determining, at a first time using the first circuit, the sense voltage is within a voltage range between a first threshold voltage and a second threshold voltage;
- delaying for a period of time; and
- after the period of time, providing the supply voltage to the first contact using a low dropout regulator.

13. The method of claim 12, the determining the sense voltage is within the voltage range comprising:
- determining the sense voltage is greater than the first threshold voltage using a first comparator of the first circuit;
- determining the sense voltage is less than the second threshold voltage using a second comparator of the first circuit; and
- determining the sense voltage is within the voltage range based on a first output of the first comparator and a second output of the second comparator.

14. The method of claim 12, further comprising:
- determining, at a second time using the first circuit, that the sense voltage is less than the first threshold voltage using a comparator; and
- decoupling the supply voltage from the first contact of the first device using the low dropout regulator.

15. The method of claim 12, further comprising:
- determining, at a second time using the first circuit, the sense voltage is greater than the second threshold voltage using a comparator;
- determining an incorrect orientation between the second contact and a corresponding contact of a second device based on the sense voltage being greater than the second threshold voltage; and
- decoupling the supply voltage from the first contact of the first device using the low dropout regulator.

16. The method of claim 12, wherein the delaying for the period of time comprises delaying the providing the supply voltage to the first contact based on a timing constant defined by a timing circuit including a resistor and a capacitor.

17. The method of claim 12, further comprising;
- dividing the supply voltage using a voltage divider circuit including a first resistor and a second resistor within the first device and including a third resistor of a second device;
- determining the sense voltage between the first resistor and the second resistor is outside of the voltage range; and
- decoupling the supply voltage from the first contact of the first device using the low dropout regulator.

18. The method of claim 17, further comprising:
- generating a first comparator output signal indicating the sense voltage is greater than the first threshold voltage;
- generating a second comparator output signal indicating the sense voltage is less than the second threshold voltage; and
- determining one of a first alignment or a second alignment of a second device relative to the first device based on the first comparator output signal and the second comparator output signal.

19. The method of claim 12, wherein the decoupling the supply voltage from the first contact comprises coupling the first contact to an electrical ground.

20. The method of claim 12, further comprising:
- determining the sense voltage is within the voltage range; and
- activating an output device to provide a visible indicator.

* * * * *